United States Patent
Chen et al.

(10) Patent No.: US 7,098,295 B2
(45) Date of Patent: Aug. 29, 2006

(54) ELECTROLUMINESCENT CONJUGATED POLYMERS CONTAINING PHOSPHORESCENT MOIETIES AND THE APPLICATION THEREOF IN LED

(75) Inventors: Show-An Chen, Hsinchu (TW); Xiwen Chen, Burnaby (CA); Jin-long Liao, Hsinchu (TW); Yongmin Liang, Lanzhou (CN)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 10/735,693

(22) Filed: Dec. 16, 2003

(65) Prior Publication Data
US 2004/0260047 A1    Dec. 23, 2004

(30) Foreign Application Priority Data
Jun. 17, 2003    (TW) .............................. 92116457 A

(51) Int. Cl.
*C08G 59/68*    (2006.01)
*H01M 4/02*    (2006.01)

(52) U.S. Cl. ...................... 528/412; 528/410; 528/380; 528/423; 528/425; 528/480; 528/397; 429/209; 428/690; 428/917

(58) Field of Classification Search ................ 528/380, 528/423, 425, 480, 397, 412, 410; 429/209; 428/690, 917
See application file for complete search history.

(56) References Cited

OTHER PUBLICATIONS

Chen et al., "High-Efficiency Red-Light Emission from Polyfluorenes Grafted with Cyclometalated Iridium complexes and Charge Transport Moiety", JACS Communications, Published on the web Dec. 18, 2002, J. Am. Chem. Soc. 2003, 125, 636-637.

*Primary Examiner*—Duc Truong
(74) *Attorney, Agent, or Firm*—Bacon & Thomas, PLLC

(57) ABSTRACT

This invention provides a new electroluminescent conjugated polymers grafted with highly efficient phosphorescent organometallic complexes (such as iridium, platinum, osmium, rubidium, etc.) and charge transport moieties (such as oxadiazole, thiadiazole, triazole, pyridine, pyrimidine, substituted or non-substituted tertiary arylamines, substituted or non-substituted quarternary arylammonium salts, substituted or non-substituted tertiary heterocyclic aromatic amines, substituted or non-substituted quarternary heterocyclic aromatic ammonium, etc.). The emissive polymers (fully conjugated or limited conjugating length) covering the full visible range can be prepared. The polymeric light emitting diodes with these materials can be used as indicators, light source and display for cellular phones, digital camera, pager, portable computer, personal data acquisition (PDA), watch, hand-held videogame, billboard, etc.

5 Claims, 2 Drawing Sheets

ELECTROLUMINESCENT CONJUGATED POLYMERS CONTAINING PHOSPHORESCENT MOIETIES AND THE APPLICATION THEREOF IN LED

FIELD OF THE INVENTION

The present invention is related to an electroluminescent conjugated polymer grafted with phosphorescent organometallic complexes, and in particular to an electroluminescent conjugated polymer grafted with phosphorescent organometallic complexes and charge transport moieties.

BACKGROUND OF THE INVENTION

In 1987, Tang, C. W. et al. (Appl. Phys. Lett., 51, 913 (1987)) reported an organic light-emitting diodes having a structure of ITO/Diamine/AlQ$_3$/Mg:Ag by evaporation of organics and metals, wherein ITO is a transparent conductive indium/tin oxide as anode, diamine as hole transport material, AlQ$_3$ is tris(8-hydroxyquinoline) aluminum as both electron transport and emissive material. This device has an external quantum efficiency of 1% and brightness of 1000 cd/m$^2$ at 10 V, which motivates a rapid development in the research of organic light emitting diodes. In 1990, Friend, R. H. et al. from the Carvendish laboratory in England made a polymer light emitting diode with a structure of ITO/PPV/Al, wherein PPV is a conjugated polymer, poly(p-phenylene vinylene). This device gives an external quantum efficiency of 0.05% and emits yellowish green light (Nature, 347, 539 (1990)). It indicates the beginning of solution processable polymer light emitting diodes. These devices utilize only the singlet exciton, wherein the rest exciton in total $\frac{3}{4}$ as the triplet is not utilized. In 1998, Forrest, S. R. et al. made a high efficiency electrophosphorescent organic light emitting diode by using platinum organic complex (Nature, 395, 151 (1998)). The triplet state of Pt complex has short lifetime and thus partial singlet property because of the spin-orbit coupling. The iridium organic complex has even stronger spin-orbit coupling and can emit various phosphorescent colors of light with different ligands [Lamansky, S. et al., J. Am. Chem. Soc., 123, 4304 (2001); Inorg. Chem., 40, 1704 (2001)]. High efficiency electrophosphosecent organic light emitting diodes emitting red, yellow, green, blue and white light were carried out [Baldo, M. A., et al., Appl. Phys. Lett., 75, 4 (1999). Adachi, C., et Al., Appl. Phys. Lett., 77, 904 (2000). Adachi, C., et al., Appl. Phys. Lett., 78, 1622 (2001). Adachi, C., et al., Appl. Phys. Lett., 79, 2082 (2001). D'Andrade, B. W., et al., Adv. Mater., 14, 147(2002)]. These small organic complexes were also blended with polymers and used for polymer light emitting diodes [Lee, C., et al., Appl. Phys. Lett., 77, 2280 (2000). Zhu, W., et al., Appl. Phys. Lett. 80, 2045 (2002]. Chen, F., et al., Appl. Phys. Lett., 80, 2308 (2002)]. However, these blend systems always have phase separation problem and higher operation voltages since large amount of small molecular charge transport materials were added. The researchers in our laboratory have introduced charge transport moieties into PPV via covalence bond to get balance of charge injection and transport, and solve the phase separation problem in physically blend system and simultaneously simplify the device fabrication process (no need for additional electron transport layer) [Lee, Y. et. al, J. Am. Chem. Soc., 123, 2296 (2001). U.S. Pat. No. 6,495,644 (2002)]. Thus it is highly desirable to develop electroluminescent materials without phase segregation problem, which can both utilize the high efficiency of phosphorescent metal-organic complexes and carry charge transport moiety for balancing the charge transport and injection.

SUMMARY OF THE INVENTION

The present invention synthesizes a novel electroluminescent conjugated polymer grafted with a side chain comprising a phosphorescent organometallic complex, and preferably further grafted with another side chain comprising a charge transport moiety. The electroluminescent conjugated polymer synthesized in the present invention can be used to make a light emitting diode emitting the light with broad band containing yellow, blue, green and red peaks.

The conjugated polymer of the present invention comprising repeating units represented by the following formula I, and its molecular weight ranges from 1,000 to 2,000,000:

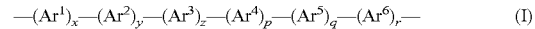

(I)

wherein $0 \leq x \leq 1$, $0 \leq y \leq 1$, $0 \leq z \leq 1$, $0 \leq p < 1$, $0 \leq q < 1$, $0 \leq r < 1$; $x+y+z+p+q+r=1$, and $x+y+z>0$; $Ar^1$, $Ar^2$, $Ar^3$, $Ar^4$, $Ar^5$ and $Ar^6$ are independently selected from the group consisting of mono-, bicyclic- and polycyclic aromatic groups; heterocyclic aromatic group; substituted aromatic group; and substituted heterocyclic aromatic group, provided that at least one of $Ar^1$, $Ar^2$ and $Ar^3$ has a substituent comprising an organometallic complex, such as an Ir-, Pt-, Os- and Rb-complex. Said substituent further comprises a spacer which covalently bonds said organometallic complex to the backbone of the polymer. Said organometallic complex comprises an element of O, N, S, P, Cl, Br, or C, and a heterocyclic ring, which coordinate the metallic element of said organometallic complex. The heterocyclic ring may be 2-phenylpyridine, 2-benzo[4,5-α]thienylpyridine, (4,6-difluoro)phenylpyridine, 2-phenylbenzothiolate, acetylacetonate, picolinate. Said spacer between said organometallic complex and the backbone of the polymer includes alkylene, alkylene containing heteroatoms, substituted alkylene, substituted alkylene containing heteroatoms, an aromatic group, a heterocyclic aromatic group, a substituted aromatic group, a substituted heterocyclic aromatic group, and a combination thereof. $Ar^1$, $Ar^2$ and $Ar^3$ may separately contain organometallic complexes emitting different light color peaks. For example, the backbone of said conjugated polymer comprises two different repeating units, each of which comprises a side chain, each side chain comprising a phosphorescent organometallic complex, wherein said two phosphorescent organometallic complexes are different. $Ar^4$ may contain a substituent having a hole transport moiety. Suitable examples of the hole transport moiety are a tertiary arylamine, a quarternary arylammonium salt, a tertiary heterocyclic aromatic amine, a quarternary heterocyclic aromatic ammonium, a substituted tertiary arylamine, a substituted quarternary arylammonium salt, a substituted heterocyclic aromatic amine, a substituted quarternary heterocyclic aromatic ammonium, and a combination thereof. Preferably, carbazole or triphenylamine is used as the hole transport moiety. The hole transport moiety is bonded to the backbone of the polymer with a divalent radical, which includes alkylene (such as decylene or hexylene), alkylene containing heteroatoms, substituted alkylene, substituted alkylene containing heteroatoms, an aromatic group, a heterocyclic aromatic group, a substituted aromatic group, a substituted heterocyclic aromatic group, and a combination thereof. $Ar^5$ may contain a substituent having an electron transport moiety, i.e. a high eletronegative heterocyclic moiety, which includes (but not limited to) a monoheterocyclic aromatic group, biheterocyclic aromatic group and polyheterocyclic aromatic group containing an oxadiazole, thiodiazole, triazole, pyridine, pyrimidine, or a combination thereof. The electron transport moiety is bonded to the backbone of the polymer with a divalent radical, which includes alkylene (such as decylene or hexylene), alkylene containing heteroatoms, substituted alkylene, substituted alkylene containing heteroatoms, an aromatic group, a heterocyclic aromatic group, a substituted aromatic group, a substituted heterocyclic aromatic group, and a combination thereof. $Ar^6$ may be grafted with a soluble substituent of an alkyl, alkoxy, alkyl containing heteroatoms, substituted alkyl, substituted alkyl containing heteroatoms, an aromatic group, a heterocyclic aromatic group, a substituted aromatic group, or a substituted heterocyclic aromatic group.

The present invention also discloses an organic light emitting diode, which comprises: a positive electrode formed on a substrate; a negative electrode; and a light emitting layer disposed between said positive electrode and said negative electrode, wherein said light emitting layer comprises the electroluminescent conjugated polymer of the present invention.

Preferably, the organic light emitting diode further comprises an electron injection layer formed between said light emitting layer and said negative electrode.

Preferably, the organic light emitting diode further comprises a hole transporting layer formed between said positive electrode and said light emitting layer.

Preferably, the organic light emitting diode is able to emit red light, yellow light, green light, blue light, white light or light with broad band containing multiple color peaks.

DETAILED DESCRIPTION OF THE INVENTION

Figure 1:
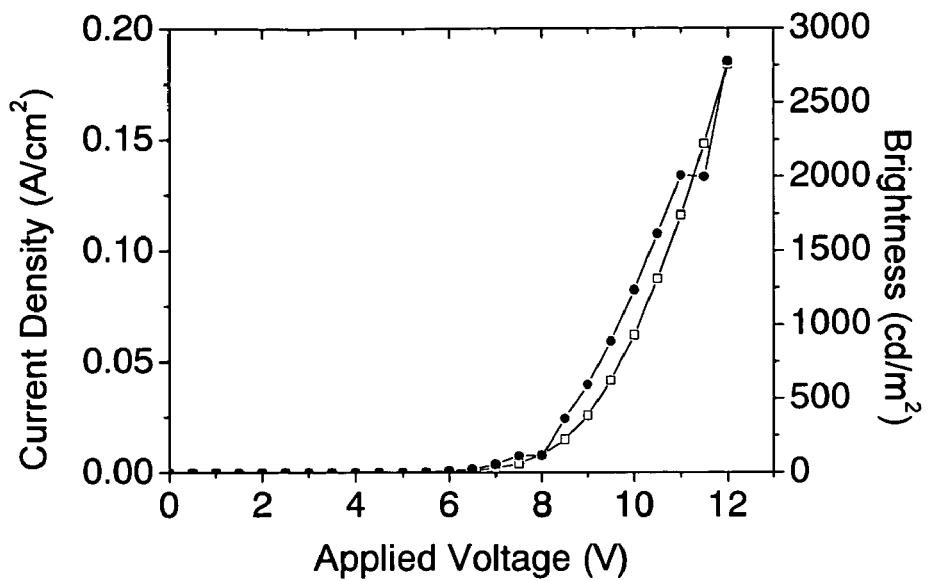
FIG. 1 is a plot showing the relationship between current density-voltage-brightness of a polymer light-emitting diode (PLED), ITO/PEDOT/CzPFR1.3/Ca/Al, prepared in Example 16 of the present invention.

The present invention discloses a conjugated polymer comprising repeating units represented by the aforesaid formula (I). The repeating units of the polymer, $Ar^1$, $Ar^2$, $Ar^3$, $Ar^4$, $Ar^5$ and $Ar^6$, may be identical or different. The backbone of the polymer of the present invention may be represented by but is not limited to the following structures (II):

The structures (II): repeating units of the backbone of the polymer

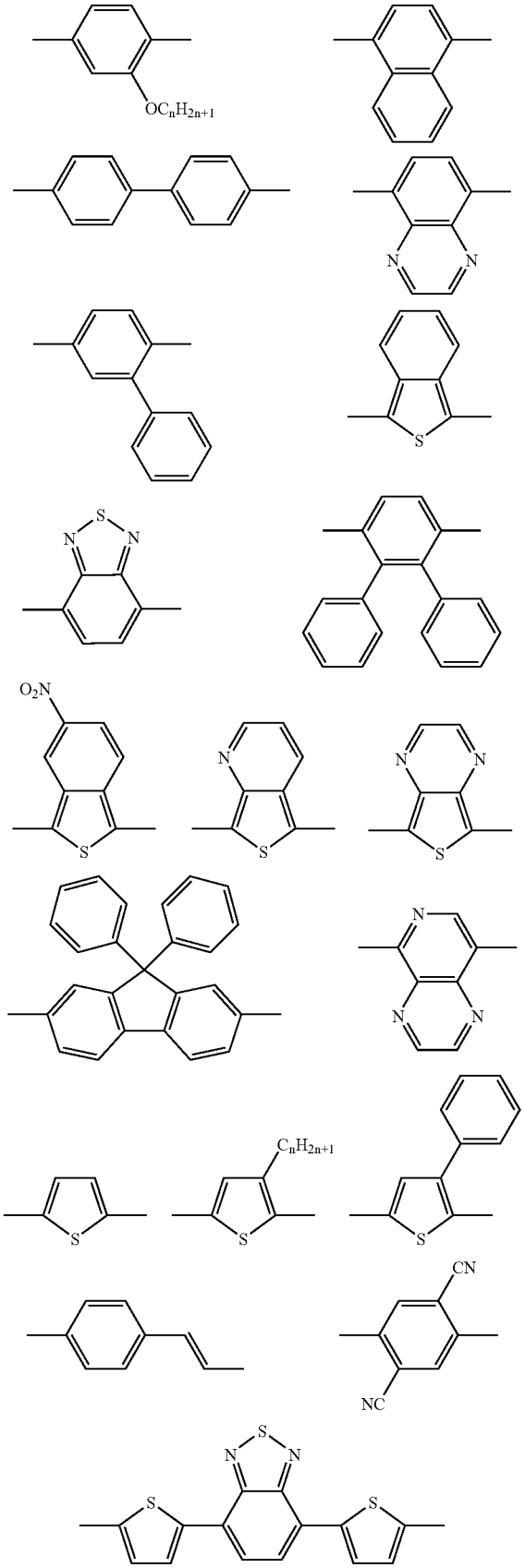

-continued
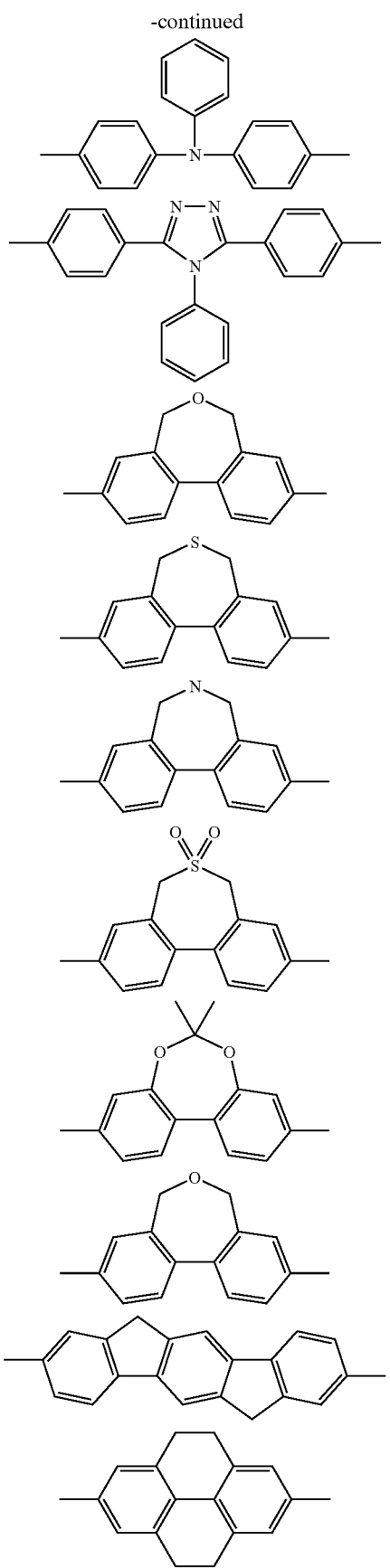
-continued
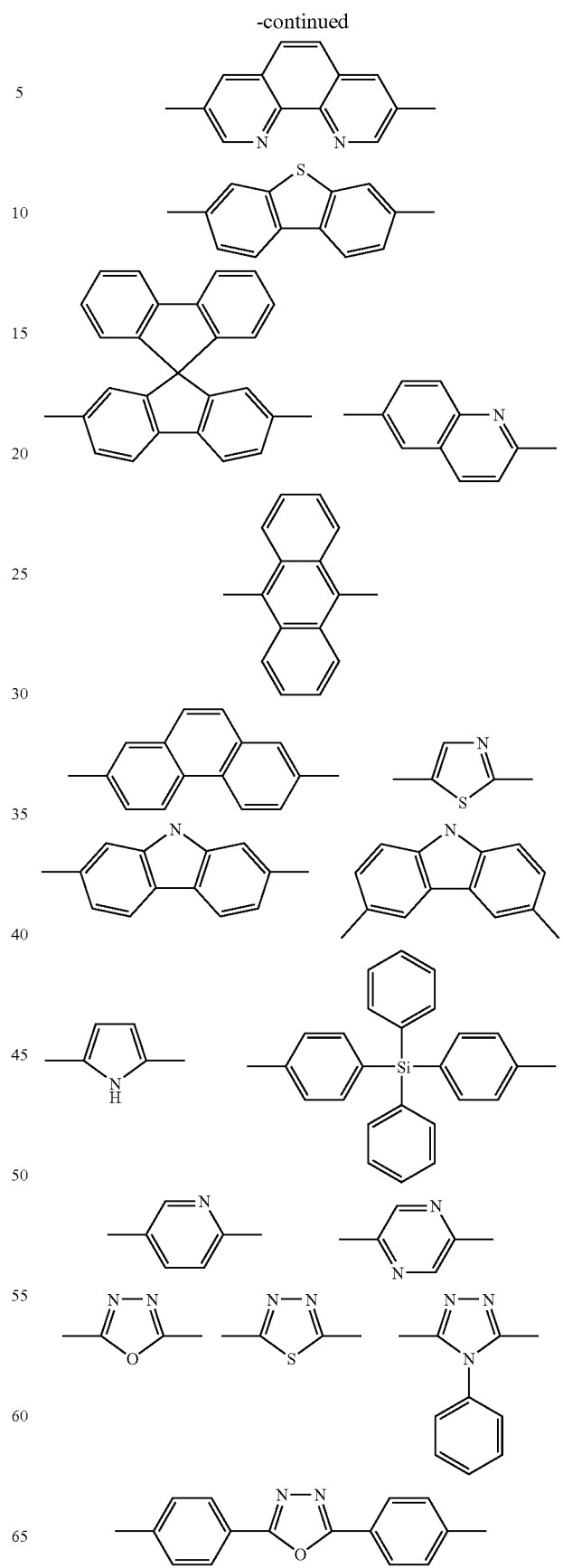

-continued
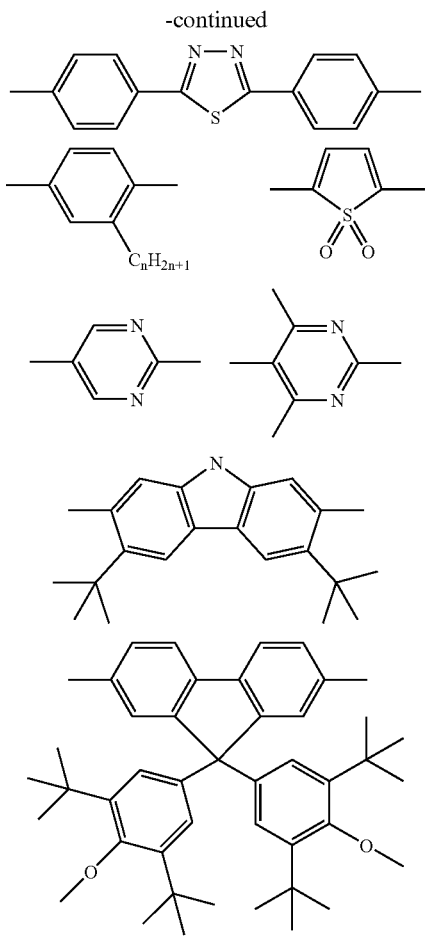
At least of the repeating units of Ar¹, Ar² and Ar³ contains a substituent comprising an organometallic complex. Suitable examples of said organometallic complex are those represented by but are not limited to the following structures (III):
The structures (III): organometallic complex
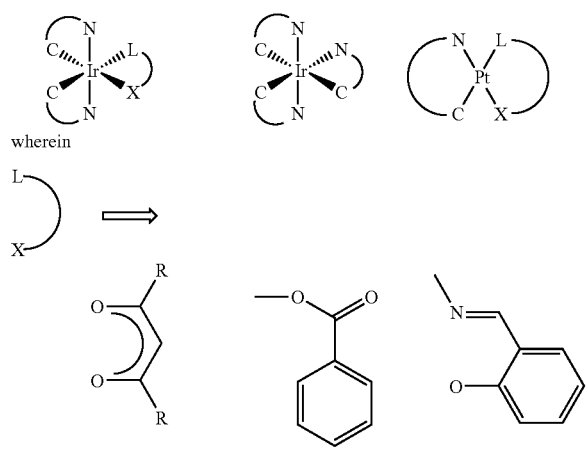
wherein R is alkyl or aryl, which may be different;
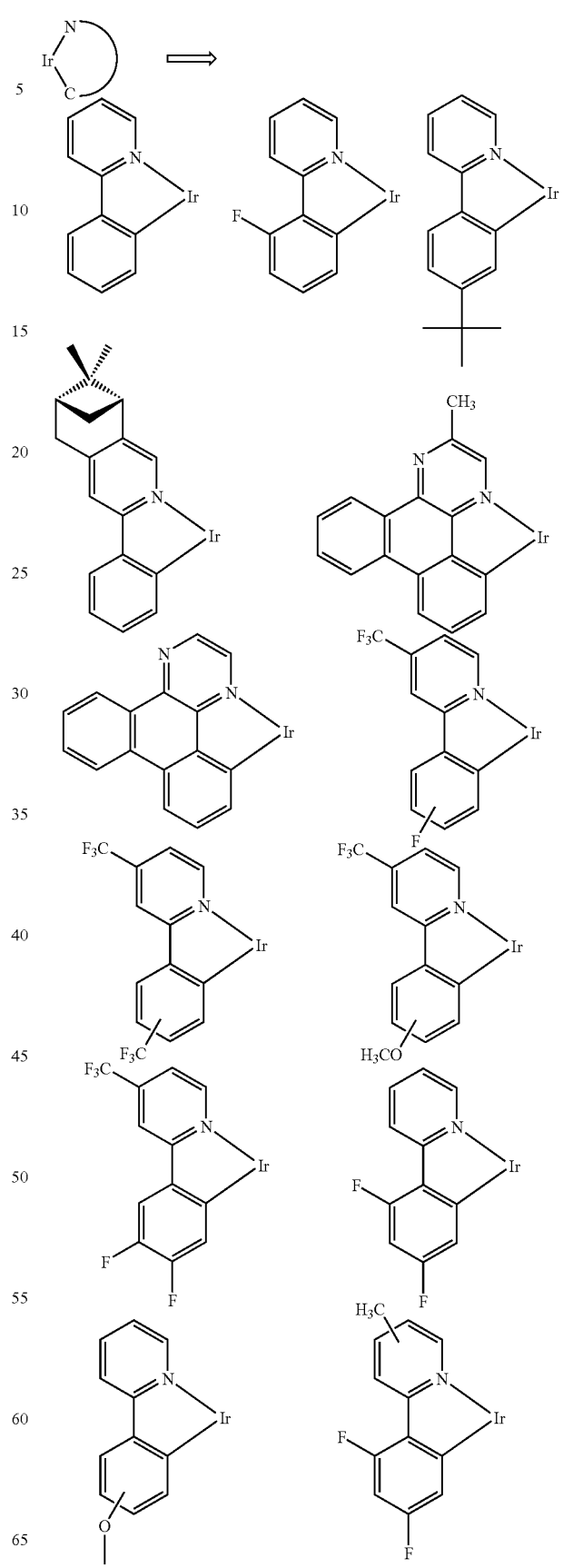

-continued
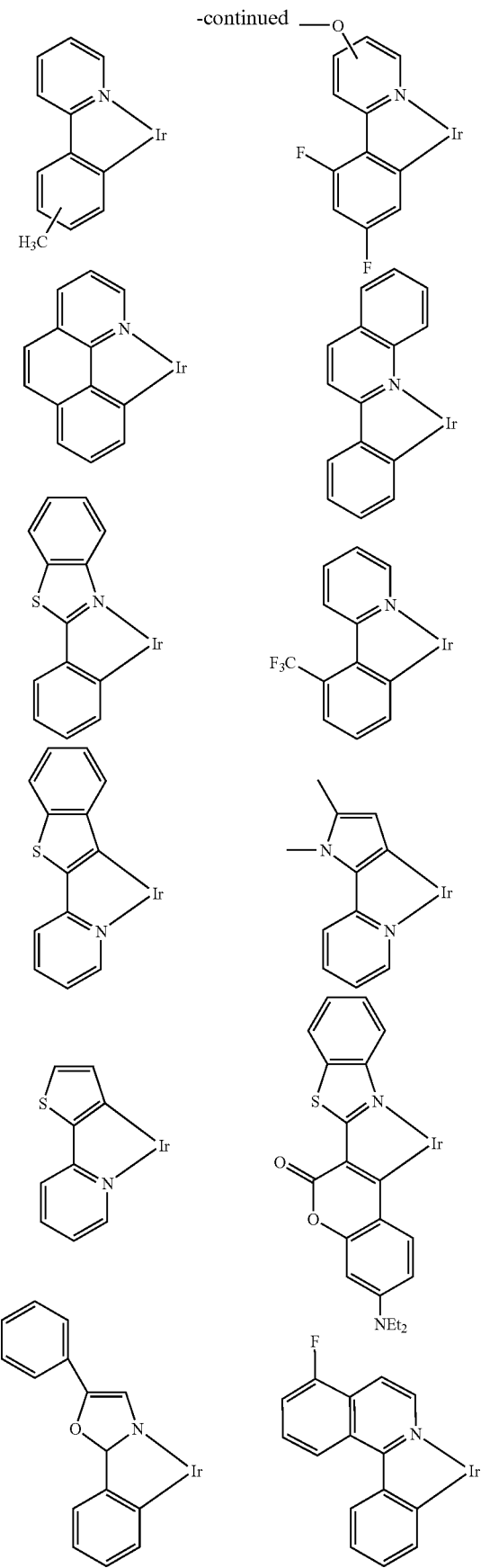
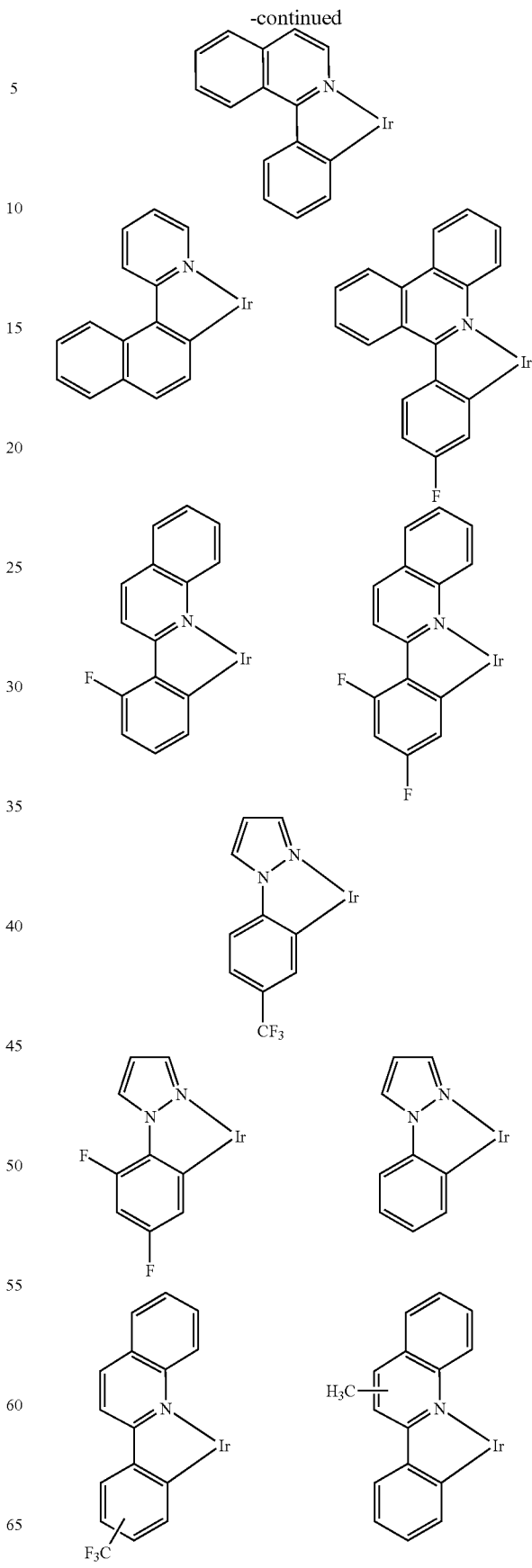

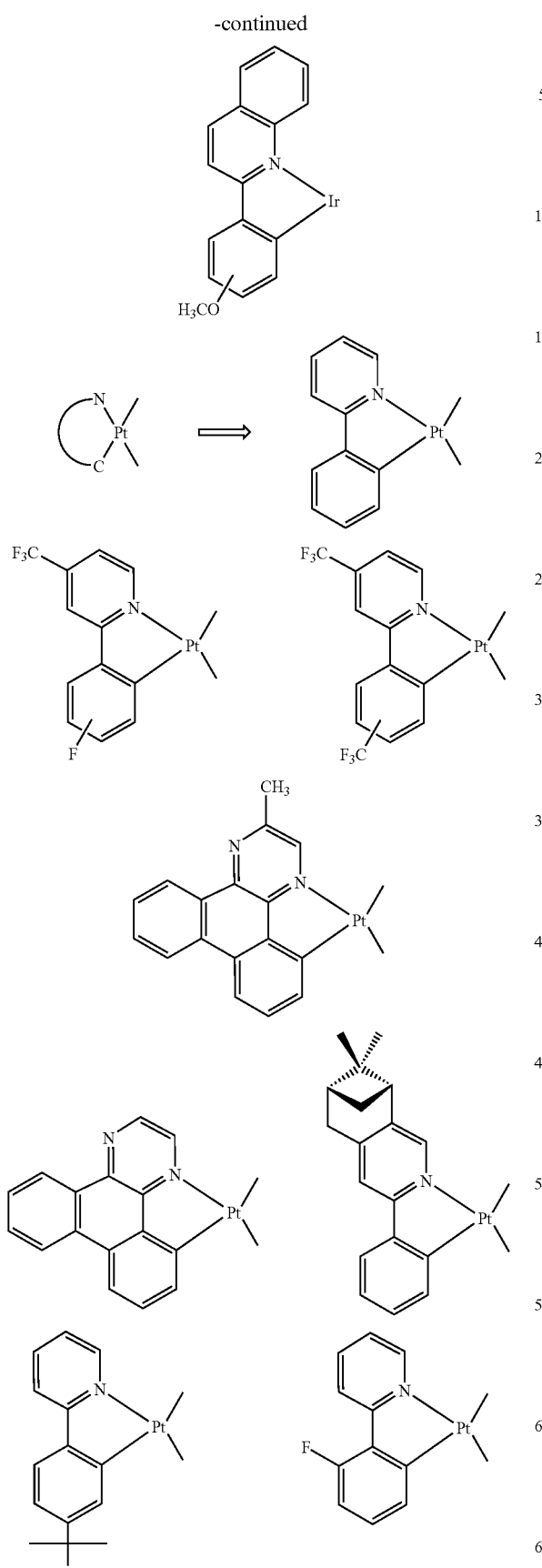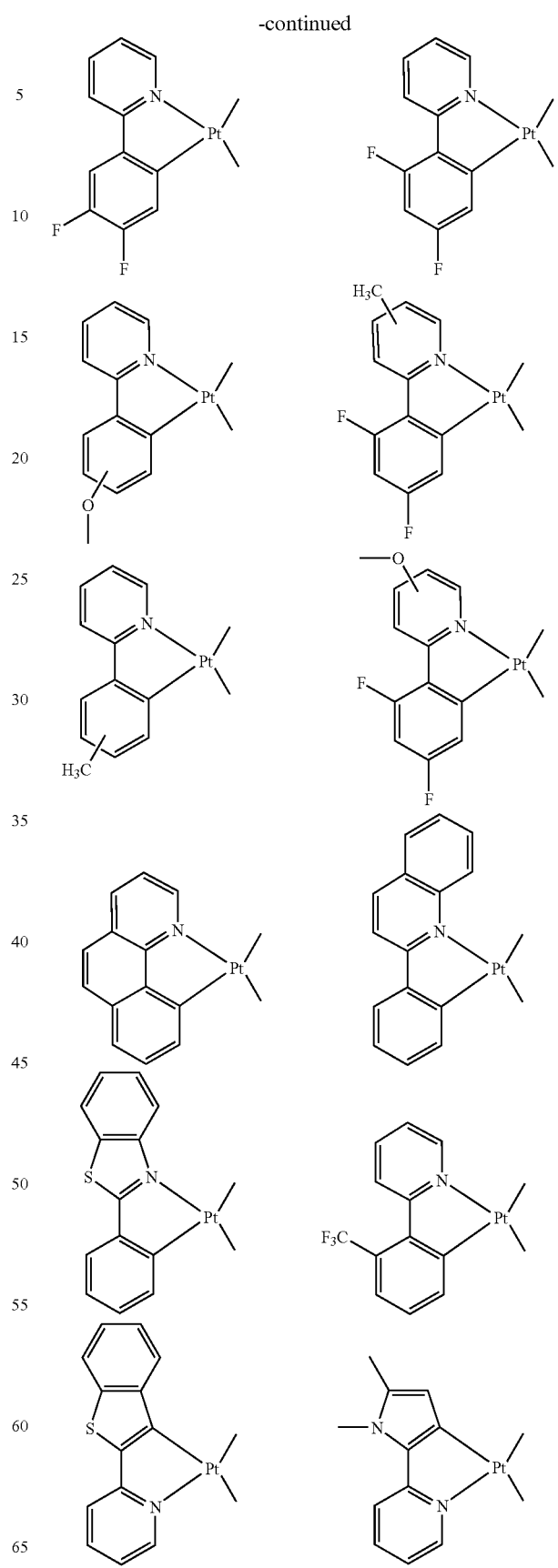

-continued

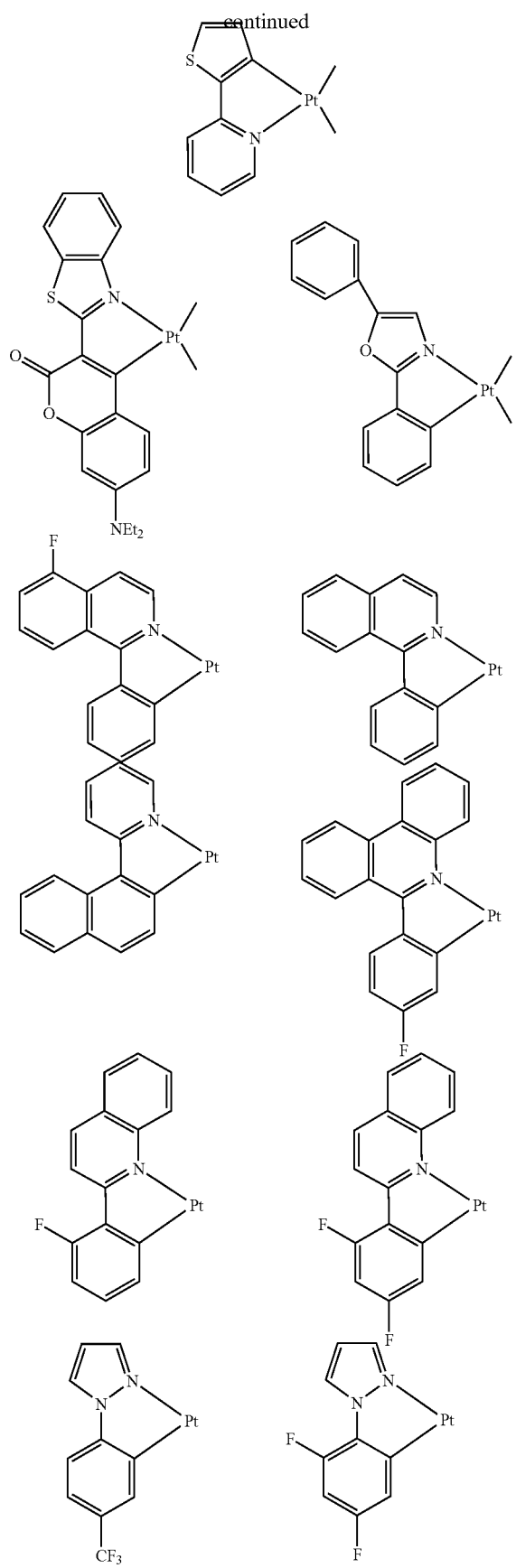

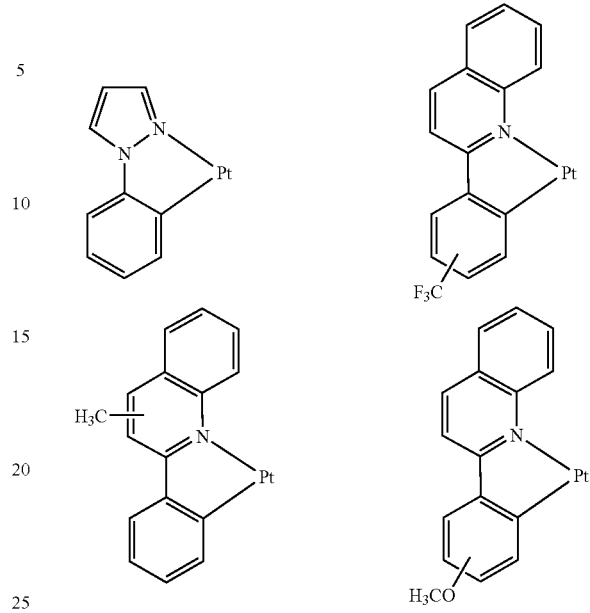

The polymer of the present invention may have one type of organometallic complex, two or more than two types of organometallic complexes.

The repeating units $Ar^4$ and $Ar^5$ of the polymer of the present invention may contain a hole transport moiety and an electron transport moiety, respectively. Suitable hole transport moiety and electron transport moiety includes (but not limited to) the following structures (IV) and (V):

The structure (IV): hole transport moiety

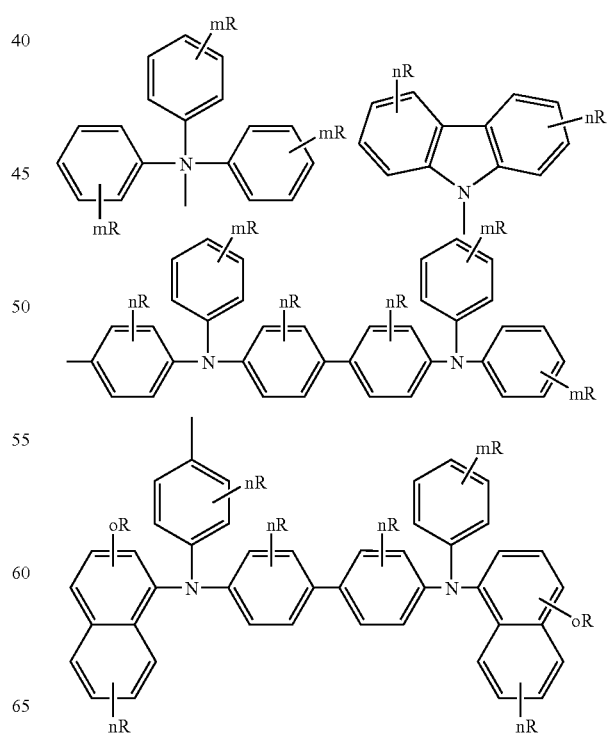

-continued

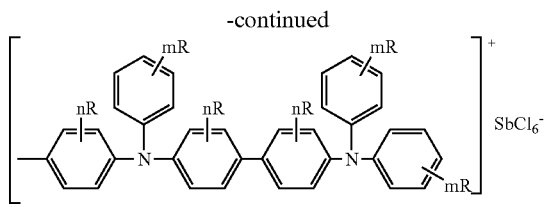

wherein m=1~5, n=1~4, o=1~3, p=1~2, R is $C_1$~$C_{22}$ alkyl, $C_1$~$C_{22}$ alkoxy, $C_1$~$C_{22}$ alkylthio, —$NR^I_3{}^+$ ($R^I$=$C_1$~$C_{22}$), —$NR^I_2$($R^I$=$C_1$~$C_{22}$), —$SiR^I_3$ ($R^I$=$C_1$~$C_{22}$), or other soluble groups, wherein R may be identical or different either on the same ring or different rings.

The structure (V): electron transport moiety

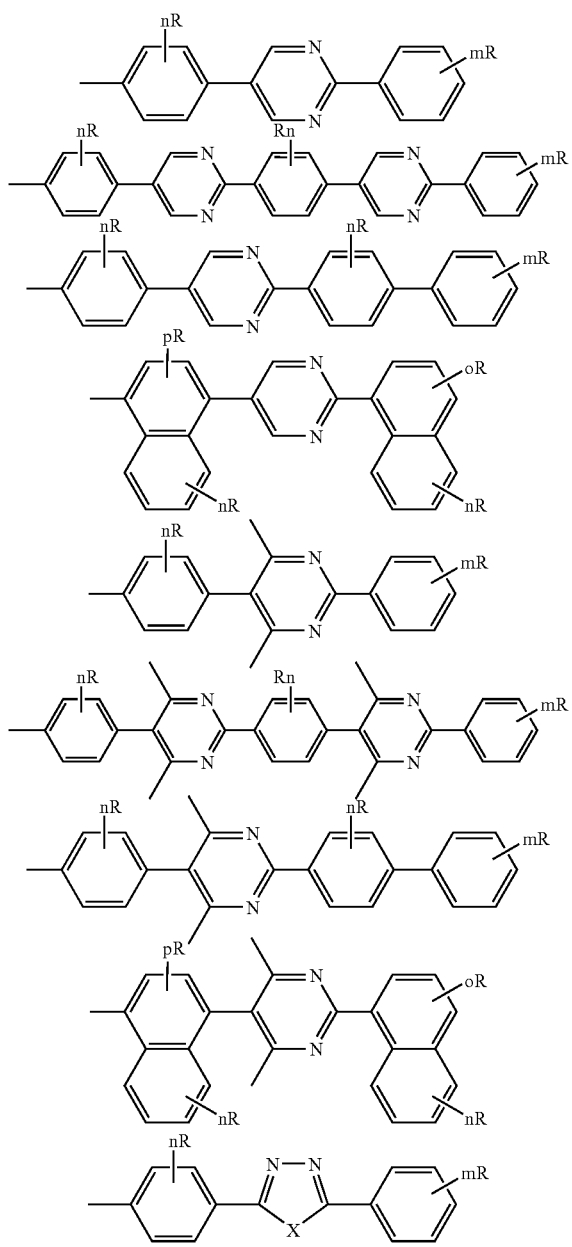

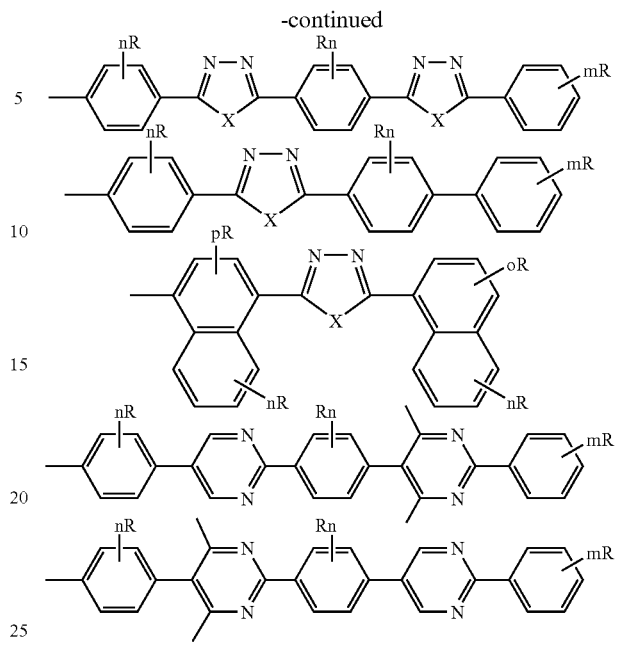

wherein m=1~5, n=1~4, o=1~3, p=1~2, R is $C_1$~$C_{22}$ alkyl, $C_1$~$C_{22}$ alkoxy, $C_1$~$C_{22}$ alkylthio, —$NR^I_3{}^+$ ($R^I$=$C_1$~$C_{22}$), —$NR^I_2$($R^I$=$C_1$~$C_{22}$), —$SiR^I_3$ ($R^I$=$C_1$~$C_{22}$) or other soluble groups, wherein R may be identical or different either on the same ring or different rings; X=O, S, or N—$R^{II}$, wherein $R^{II}$ is $C_1$~$C_{22}$ alkyl, $C_1$~$C_{22}$ alkoxy, phenyl, $C_7$~$C_{28}$ alkylaryl, $C_7$~$C_{28}$ alkoxyaryl, phenoxy, $C_7$~$C_{28}$ alkylphenoxy, $C_7$~$C_{28}$ alkoxyphenoxy, diphenyl, diphenoxy, $C_{13}$~$C_{34}$ alkyldiphenyl, $C_{13}$~$C_{34}$ alkoxydiphenyl, $C_{13}$~$C_{34}$ alkyldiphenoxy, or $C_{13}$~$C_{34}$ alkoxydiphenoxy.

The polymer of the present invention may have one type of charge transport moiety, two or more than two types of charge transport moieties.

The repeating unit $Ar^6$ of the polymer of the present invention may have a side-chain substituent selected from $C_1$~$C_{22}$ alkyl, $C_1$~$C_{22}$ alkoxy, $C_1$~$C_{22}$ alkylthio, —$NR^I_3{}^+$ ($R^I$=$C_1$~$C_{22}$), —$NR^I_2$($R^I$=$C_1$~$C_{22}$), —$SiR^I_3$ ($R^I$=$C_1$~$C_{22}$), phenyl, $C_7$~C28 alkylaryl, $C_7$~$C_{28}$ alkoxyaryl, phenoxy, $C_7$~$C_{28}$ alkylphenoxy, $C_7$~$C_{28}$ alkoxyphenoxy, diphenyl, diphenoxy, $C_{13}$~$C_{34}$ alkyldiphenyl, $C_{13}$~$C_{34}$ alkoxydiphenyl, $C_{13}$~$C_{34}$ alkyldiphenoxy, $C_{13}$~$C_{34}$ alkoxydiphenoxy. or other soluble groups.

The organometallic complex or charge transport moiety is bonded to the backbone of the polymer of the present invention with a spacer. Suitable spacers include $C_1$~$C_{22}$ alkylene, $C_1$~$C_{22}$ alkylene containing heteroatoms, substituted $C_1$~$C_{22}$ alkylene, substituted $C_1$~$C_{22}$ alkylene containing heteroatoms, $C_5$~$C_{22}$ aromatic group, $C_4$~$C_{22}$ heterocyclic aromatic group, $C_5$~$C_{22}$ substituted aromatic group, $C_4$~$C_{22}$ substituted heterocyclic aromatic group, and a combination thereof.

The polymer of the present invention can be a homopolymer or a copolymer, which can be a random copolymer, block copolymer or alternating copolymer. The copolymer may comprise a non-conjugated sector among two or more conjugated sectors in a backbone of said copolymer. In the backbone of the polymer of the present invention the repeating unit containing the organometallic complex ranges from 0.05 to 100 mol %, preferably from 0.1 to 20 mol %, and more preferably from 0.5 to 10 mol %; the repeating unit containing the charge transport moiety ranges from 0 to 99.95 mol %; and the repeating unit containing other substituent ranges from 0 to 99.95 mol %.

Preferably, the polymer of the present invention further comprises a crosslinkable or printable functional group Preferably, the polymer of the present invention has a number average molecular weight of 1,000~2,000,000, more preferably 5,000~1,000,000, and most preferably 10,000~600,000.

Examples of the polymer of the present invention are shown by the following structures (VI) to (VIII):

The structure (VI): polymers CzPFR1.3 and CzPFR08

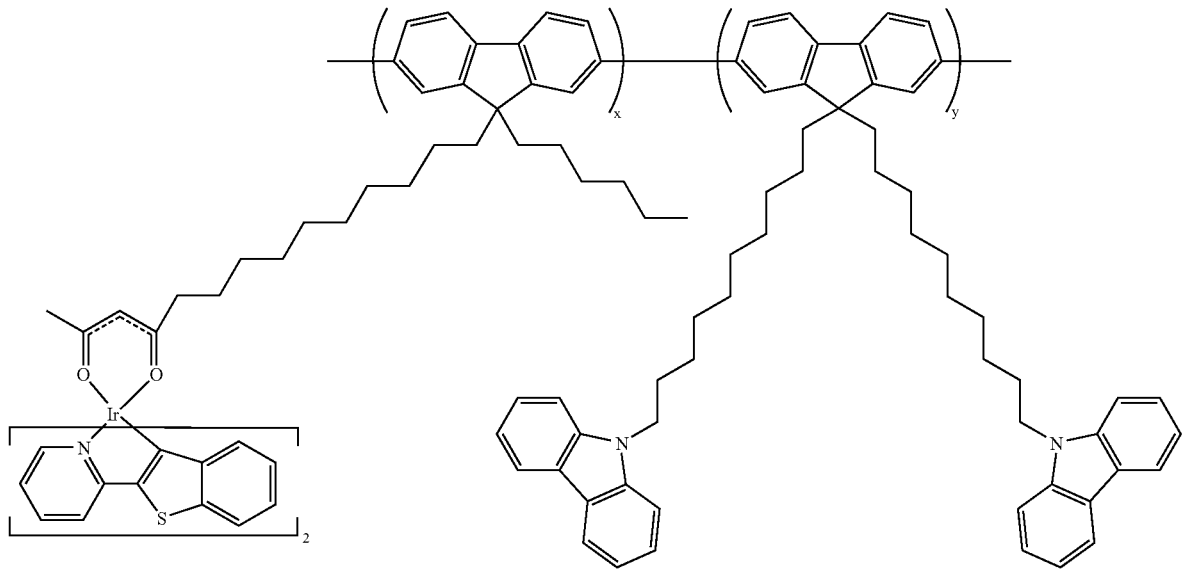

wherein the polymer CzPFR1.3 has x=1.3%, and y=98.7%; the polymer zPFR08 has x=0.8%, and y=99.2%.

The structure (VII): polymer PFOR1

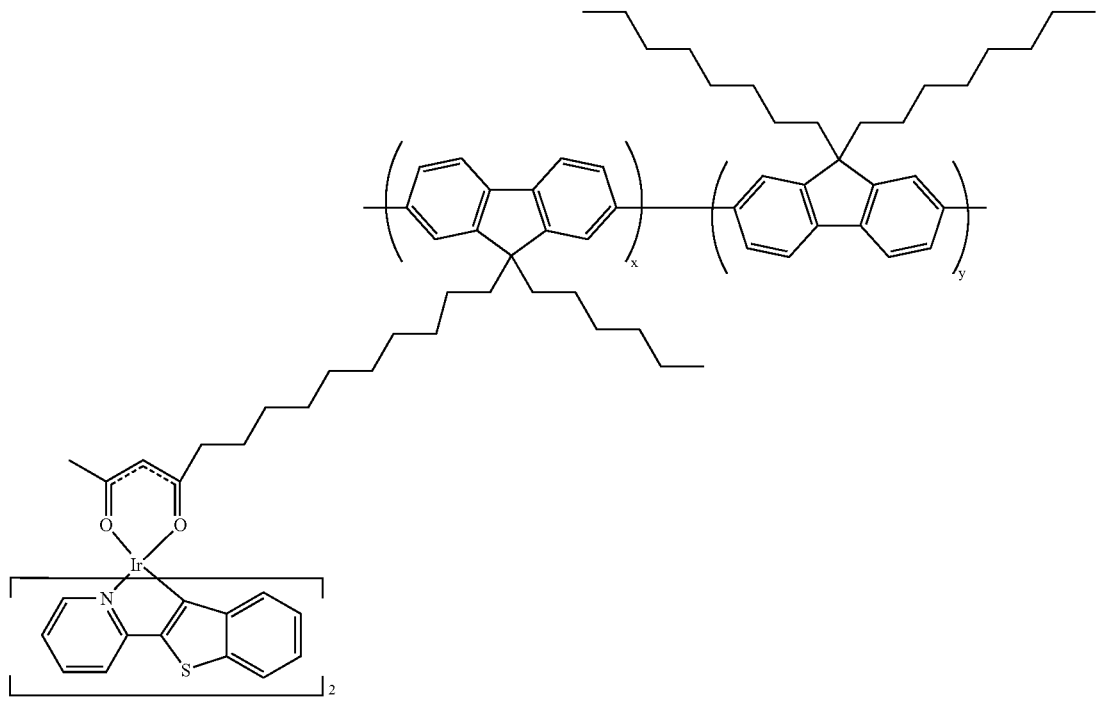

wherein x=1%, and y=99%.

The structure (VIII): polymer PFOG05R01

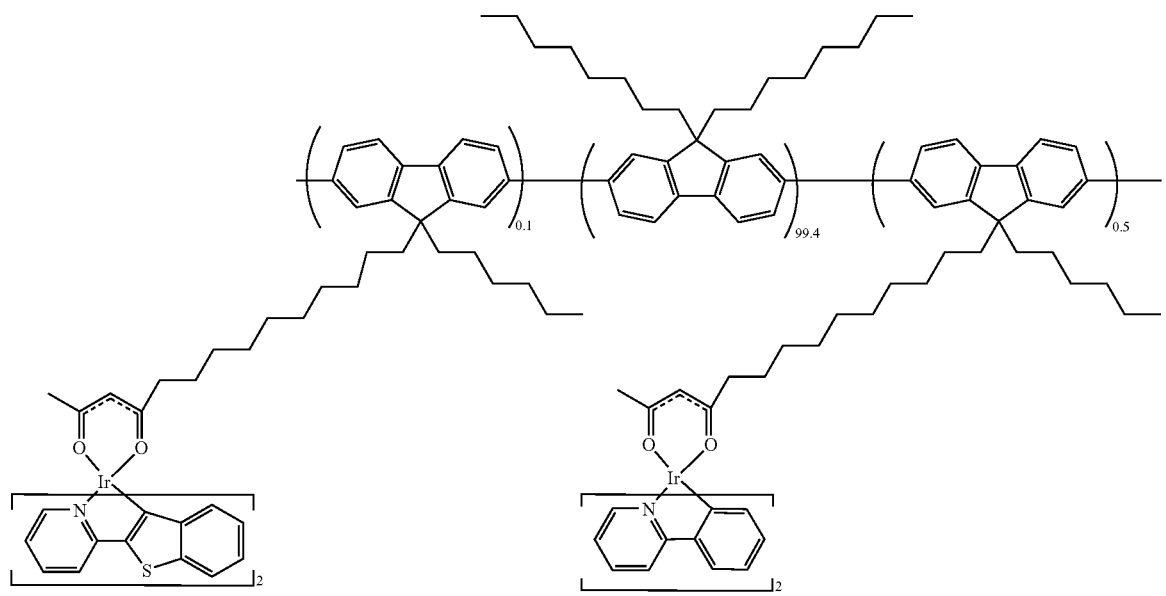

The present invention will be elucidated by the following examples, which are illustrative only and not for limiting the scope of the present invention.

The polymer of the present invention can be synthesized by copolymerizing suitable monomers which are able to form a conjugated polymer, for example, via the coupling reactions disclosed by Suzuki or Yamamoto. The following compounds are examples of the suitable monomers for synthesis of the polymer of the present invention, which are merely illustrative and not for restricting the scope of the present invention:

-continued

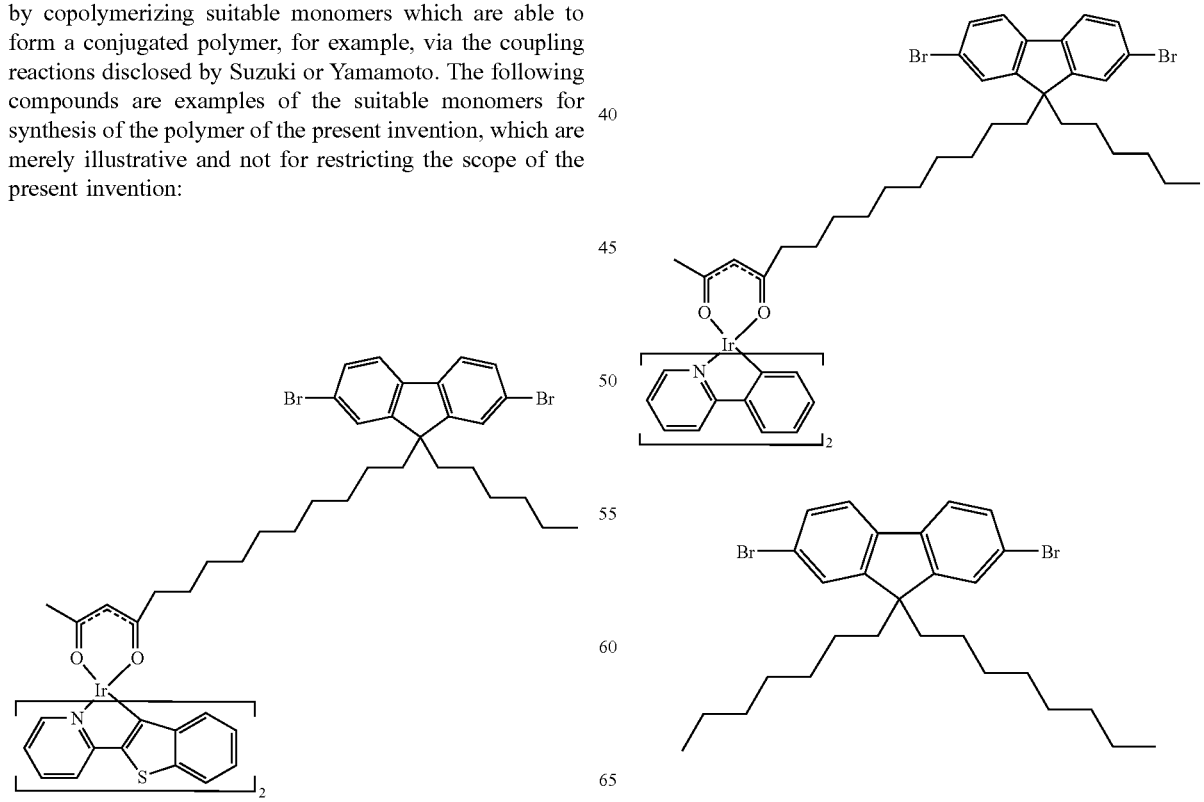

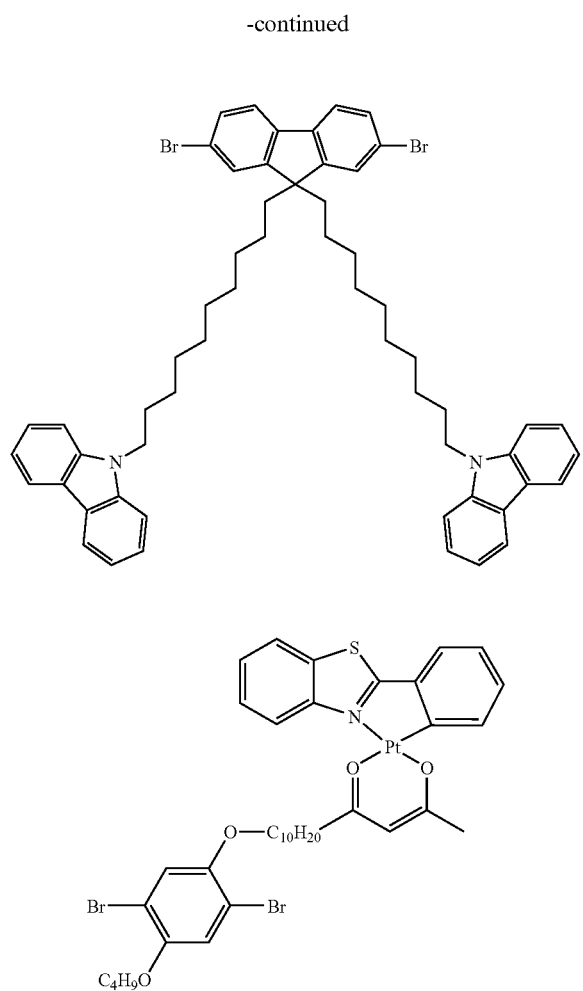
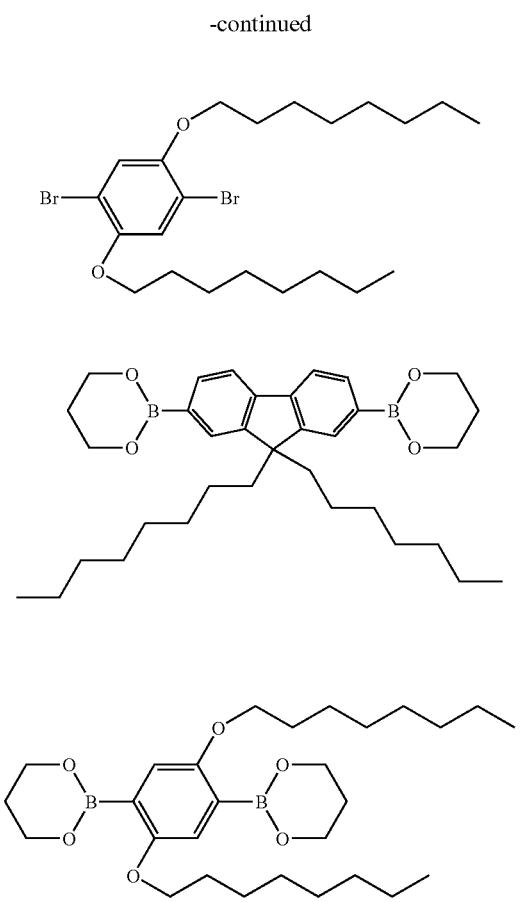
The synthetic routes for the compounds prepared in the following Examples 1 to 5 and 7 compounds are shown in Scheme 1.
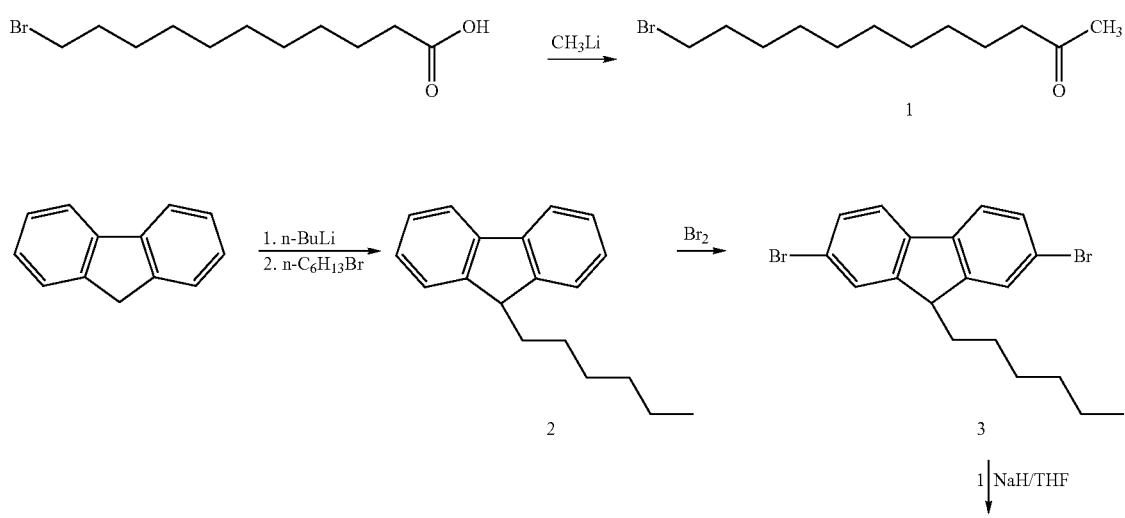

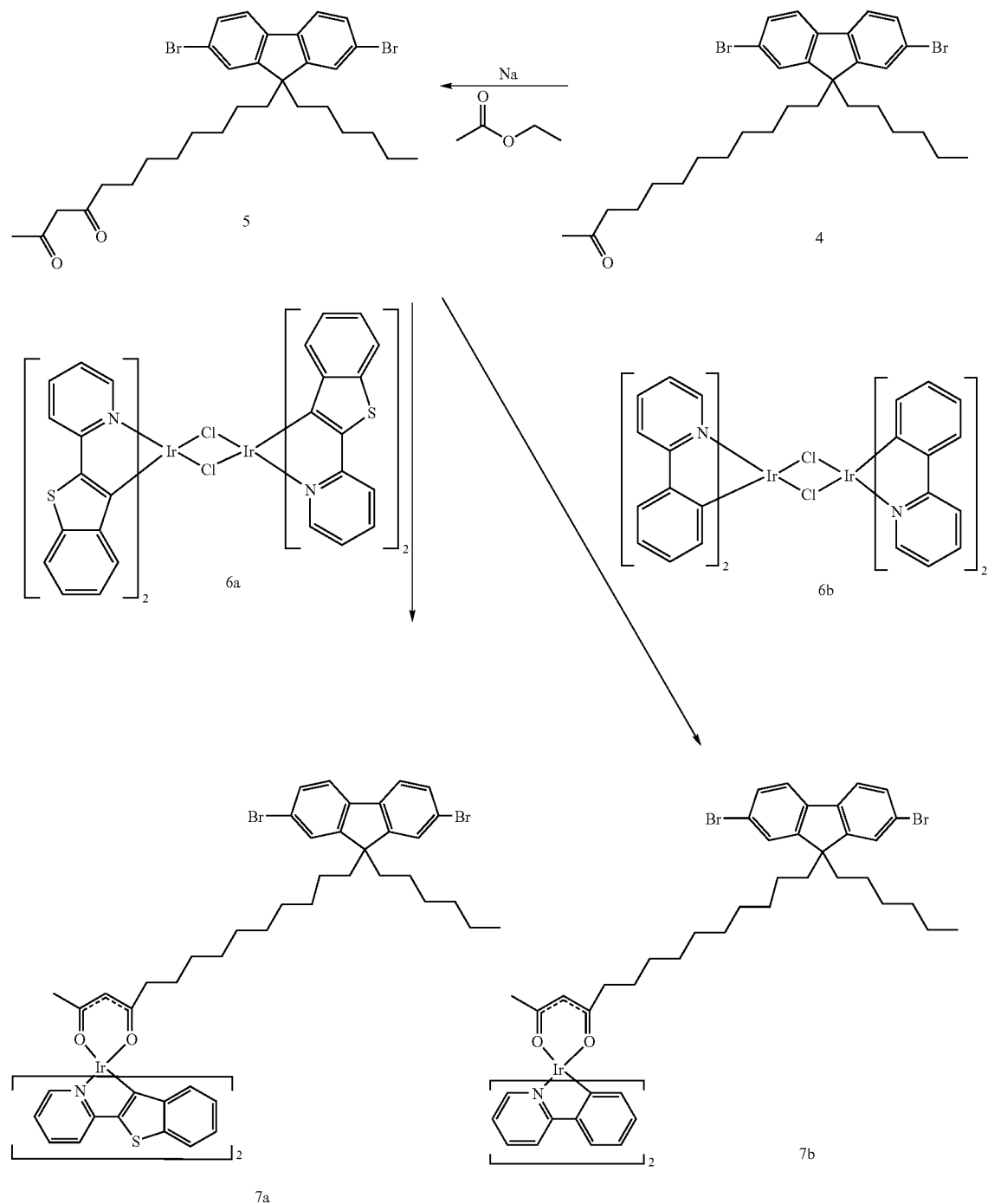

EXAMPLE 1

12-bromododecan-2-one (1). 11-Bromoundecanoic acid (37.7 mmol, 10 g) was dissolved in THF (300 mL). The solution was cooled to −78° C., and a 1.6 M solution of $CH_3Li$ (75.4 mmol, 47.1 mL) in diethylether was added dropwisely. The reaction mixture was allowed to warm to 0° C. and quenched with saturated ammonium chloride followed by extraction with ether. The ether phase was separated, dried over $MgSO_4$, and concentrated. Purification by silica gel column chromatography (hexane/ethyl acetate) gave 6.9 g (yield 70%) of a colorless oil. The compound (1) was confirmed by GC/MS (m/z=262).

EXAMPLE 2

9-hexylfluorene (2). To a solution of fluorene (33.2 g, 0.20 mol) in 300 mL THF at −78° C., n-butyllithium (2.5 M, 80 mL) was added dropwisely. The mixture was stirred at −50° C. for 45 minutes, and then cooled to −78° C. again and n-hexylbromide (33.0 g, 0.20 mol) in THF (25 mL) was added dropwise to the mixture. The solution was allowed to warm up to room temperature and stirred for 5 h. The mixture was then poured into water and extracted with ether. The organic extracts were washed with brine and dried over magnesium sulfate, and purified by silica gel column with hexane to give pure compound 2 (38 g, yield 76%).

EXAMPLE 3

2,7-dibromo-9-hexylfluorene (3). To a solution of 9-hexylfluorene (38.0 g, 0.158 mol) in 200 mL chloroform at −78° C., ferric chloride (400 mg) and 2,6-di-t-butyl-4-methylphenol (20 mg) were added. Bromine (17.2 mL, 0.335 mol) was added dropwisely to the mixture while keeping all in the dark. The mixture was warmed to room temperature and stirred overnight. The resulting slurry was poured into water (300 mL). The aqueous layer was extracted with chloroform, and the combined organic phase was washed with aqueous sodium thiosulfate until the red color disappeared. The crude product was recrystallized from ethanol twice to give a colorless crystal (57 g, yield 88%).

EXAMPLE 4

9-n-hexyl-9-(11-oxo-dodecan-one)-2,7-dibromofluorene (4). To a solution of 2,7-dibromo-9-hexylfluorene (49.0 mmol, 20.0 g) in THF, sodium hydride (98 mmol, 2.35 g) was added. The mixture was refluxed for 1 h under $N_2$ atmosphere; and 12-bromododecan-2-one (1) (49.0 mmol, 12.8 g) was added dropwisely. The mixture was refluxed for 12 h and then cooled to room temperature. Then it was filtered to remove the insoluble material and the solvent was removed by vacuum. The crude product was purified by silica column chromatography (85:15 hexane/ethylacetate) to afford 20 g (yield 70%) of the compound (4). $^1$H NMR (CDCl$_3$) δ (ppm): 7.36–7.45 (m, 6H), 2.32 (t, 2H), 2.02 (s, 3H), 1.87–1.89 (m, 4H), 0.55–1.47 (m, 27H); $^{13}$C NMR (CDCl$_3$) δ 208.37, 152.18, 138.70, 129.86, 125.84, 121.22, 120.85, 55.33, 43.35, 39.84, 31.10, 29.01–29.48, 28.43–28.81, 27.83, 23.31–23.43, 22.25, 13.73.

EXAMPLE 5

9-hexyl-9-(11,13-dioxo-tetradecyl)-2,7-dibromofluorene (5). 2,7-dibromo-9- hexylfluorene (10 mmol, 6.0 g) and ethylacetate (25 mL) were mixed and cooled to 0° C. Sodium (20 mmol, 0.46 g) was added. The mixture was refluxed for 12 h, cooled and poured into ice. The organic layers were separated and washed three times with water. The combined aqueous layers were acidified with diluted acetic acid. The diketone (5) was extracted with ether and purified by silica column chromatography to afford as an oil 4.8 g (yield 75%). $^1$H NMR (CDCl$_3$) δ (ppm): 7.38–7.46 (m, 6H), 5.42 (s, ~0.83H, enol form), 3.51 (s, 0.26H. keto form), 2.18 (t, 2H), 1.97 (s, 3H), 1.88 (t, 4H), 1.54–0.56 (m, 27H); $^{13}$C NMR(CDCl$_3$) δ 203.85 and 201.72 (keto form), 193.96 and 191.04 (enol form), 152.27, 138.79, 129.93, 125.92, 121.29, 120.91, 99.49, 55.41, 43.52, 39.94, 39.85, 37.99, 31.20, 29.57–29.03, 28.95–28.74, 25.78, 23.42–23.11, 22.33, 13.79.

EXAMPLE 6

Chloride-bridged dimer [(btp)$_2$Ir-(μ-Cl)$_2$Ir(btp)$_2$(6a), btp=2-benzo[4,5-.]thienylpyridine] and [(ppy)$_2$Ir-(μ-Cl)$_2$Ir (ppy)$_2$(6b), ppy=2-phenylpyridine]. 6a and 6b were synthesized by the method reported by Nonoyama (Nonoyama, M. Bull. Chem. Soc. Jpn. 1974, 47, 767.), which involves refluxing IrCl$_3$.nH$_2$O with 2~2.5 equiv of cyclometalating ligand (btp or ppy) in a 3:1 mixture of 2-methoxyethanol and water.

EXAMPLE 7

Ir red complex monomer 9-hexyl-9-(iridium(III)bis(2-(2'-benzo[4,5-.]thienyl)pyridinato-N,C$^{3'}$) (tetradecanedionate-11,13)-2,7-dibromofluorene (7a). Chloride-bridged dimer 6a (0.74 g, 0.57 mmol) of, 4 (0.90 g, 1.422 mmol) and sodium carbonate (100 mg) were mixed and refluxed under $N_2$ atmosphere in 2-ethoxyethanol for 15 h. The solution was cooled to room temperature, and the colored precipitate was filtered and washed with water and hexane. The crude product was subjected to chromatographic work up using a silica/dichloromethane column to yield ca. (75–80%) of the compound (7a). It was further purified by TLC plate (30% dichloromethane and 70% hexane). $^1$H NMR (CDCl$_3$) δ (ppm): 8.41 (d, 2H), 7.71 (t, 2H), 7.44–7.64 (m, 10H), 7.06 (t, 2H), 6.95 (t, 2H), 6.82 (t, 2H), 6.29 (d, 1H), 6.22 (d, 1H), 5.24 (s, 1H), 1.98 (m, 6H), 1.80 (s, 3H), 1.48–0.60 (m, 27H); $^{13}$C NMR (CDCl$_3$) δ (ppm): 188.34, 184.55, 166.05, 152.49, 149,18, 149.09, 146.90, 146.78, 146.50, 146.26, 142.29, 142.14, 137.94, 135.04, 130.13, 126.10, 125.74, 124.82, 123.52, 122.63, 121.15, 100.22, 55.60, 41.33, 40.17, 31.42, 29.93–28.47, 27.02, 23.65, 22.69–22.54, 13.96. Anal. Calcd: C, 56.95; H, 4.78; N, 2.25, S, 5.15; Found: C, 58.15; H, 5.06; N, 2.24; S, 5.09.

High-resolution MS: calculated M$^+$ 1244.1964; observed M$^+$ 1244.2001.

Ir green complex monomer 9-hexyl-9-(iridium(III)bis(2-phenyl pyridinato-N,C$^{2'}$)(tetradecanedionate-11,13)-2,7-dibromofluorene (7b). Similar to the method for 7a, 4 (0.90 g, 1.42 mmol) and 6b (0.5 g, 0.51 mmol) and sodium carbonate (100 mg) were used for the preparation. $^1$H NMR (CDCl$_3$) δ (ppm): 8.46 (d, 2H), 7.43~7.69 (m, 12H), 7.07 (m, 2H), 6.77 (m, 2H), 6.66 (m, 2H), 6.32 (d, 1H), 6.23 (d, 1H), 5.16(s, 1H), 1.95 (m, 6H), 1.89 (s, 3H), 1.22 (b, 3H), 0.99~1.20 (m, 18H), 0.77 (m, 2H), 0.61 (b, 4H). $^{13}$C NMR (CDCl$_3$) δ (ppm): 188.35, 184.59, 168.61, 168.52, 152.92, 152.51, 150.62, 150.26, 148.23, 148.16, 147.93, 147.80, 144.75, 144.70, 141.07, 140.12, 140.00, 139.04, 136.73, 136.67, 133.31, 133.03, 129.86, 129.06, 128.94, 127.45, 126.95, 126.91, 126.66, 126.13, 126.09, 123.80, 123.64, 122.83, 122.79, 121.44, 121.31, 121.18, 121.02, 120.93, 120.64, 120.60, 119.73, 119.61, 118.32, 118.11, 100.00, 55.66, 55.34, 54.97, 41.64, 40.38, 40.26, 40.19, 31.44, 30.03, 29.94, 29.85, 29.68, 29.60, 29.53, 29.48, 29.36, 29.22, 28.81, 28.75, 27.10, 23.75, 23.68, 23.63, 22.53, 13.96. High-resolution MS: calculated M$^+$ 1132.2552; observed M$^+$ 1132.2560.

The synthetic routes for the compounds synthesized in Examples 8–11 are shown in Scheme 2.

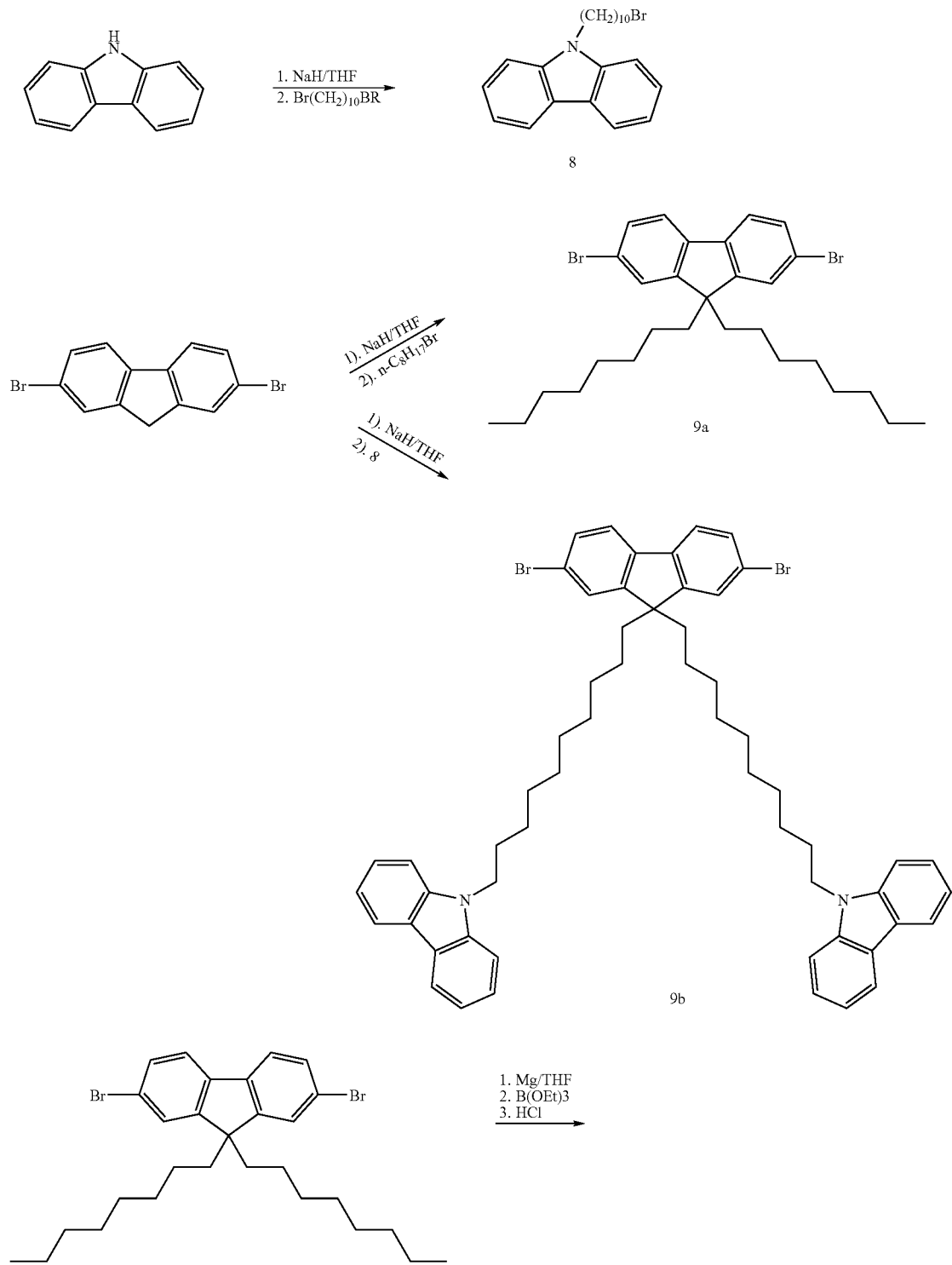
Scheme 2

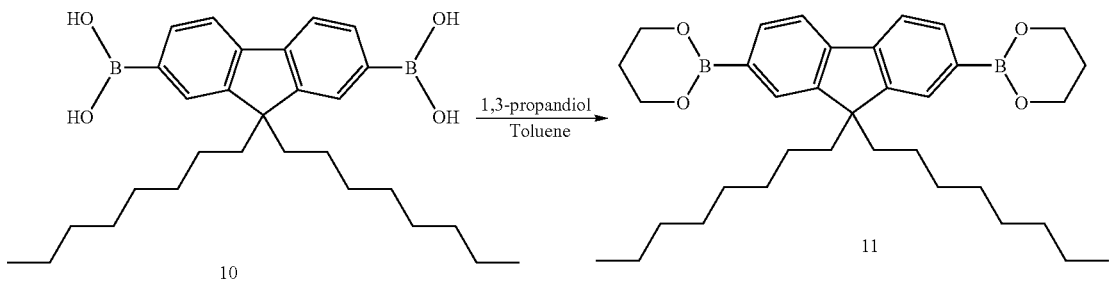

EXAMPLE 8

N-(10-bromodecyl)-carbazole (8). 10 g (0.25 mol) sodium hydride (60%) was added in several portions into a solution of 30.6 g (0.20 mol) carbazole in 200 mL THF. Then the mixture was transferred into a funnel from which it was added dropwisely into a solution of 180 g (0.6 mol) dibromodecane in 500 mL THF at 70° C. and the mixture was refluxed for 48 h. After cooling, it was filtered. The filtrate was distilled in order to remove remaining dibromodecane. The residue was diluted with water and extracted with $CH_2Cl_2$. The organics was washed with brine and dried over anhydrous $MgSO_4$ overnight. After removed the solvent by rotary evaporator, it was purified by silica chromography to give 31.6 g (41%, yield, mp 38~40° C.) white solid product. $^1H$ NMR (500 MHz, $CDCl_3$), δ (ppm): 8.14 (2H, d), 7.51 (2H, d), 7.44 (2H, d), 7.26 (2H, d), 4.30 (2H, t), 3.41 (2H, t), 1.27~1.90 (16H, m).

EXAMPLE 9

9,9-di-(n-octyl)-2,7-dibromofluorene (9a). To a solution of 28.5 g (88 mmol) 2,7-dibromofluorene in 800 mL THF was added 8.8 g (220 mmol) sodium hydride (60%) in several portions at room temperature. The mixture was heated at 60° C. and 43 g (220 mmol) bromooctane in 200 mL THF was added dropwisely into the mixture and refluxed overnight. The mixture was concentrated and diluted with water, and then extracted with diethyl ether. After washing with brine, the ether solution was dried over anhydrous $MgSO_4$ and the ether was then removed by evaporation. This crude solid was purified by a silica chromography with hexane and recrystallized from ethanol to give white solid (36.3 g, yield 75.3%, mp. 52~54° C.). $^1H$ NMR (500 MHz, $CDCl_3$), δ (ppm): 7.51 (2H, d), 7.44 (2H, d), 7.41 (2H, s), 1.89 (4H, m), 1.02~1.20 (20H, m), 0.81 (6H, t), 0.56 (4H, m).

9,9-Bis(N-carbazolyl-decyl)-2,7-dibromofluorene (9b). To a mixture of 5.2 g (16 mmol) 2,7-dibromofluorene in 300 mL THF was added 1.3 g (41 mmol) sodium hydride (75%) in several portions. A mixture of 15 g (39 mol) N-(10-bromodecyl)-carbazole (8) in 100 mL THF was added dropwisely at 70° C. and the mixture was refluxed for 48 h. After cooling, the solid was filtered and the filtrate was concentrated and dilute with water and extracted with $CH_2Cl_2$. The organic layer was collected and washed with brine and dried with anhydrous $MgSO_4$. The crude product was further purified by silica column chromography to give 5.1 g (yield 34%, mp 94~96° C.) title product. $^1H$ NMR ($CDCl_3$), δ (ppm): 8.10 (4H, d), 7.38~7.48 (14H, m), 7.23 (4H, t), 4.27 (4H, t), 0.88~1.86 (36H, m). Anal. Calcd: C, 73.22; H, 6.68; N, 3.00. Found: C, 72.58; H, 6.59; N, 2.73.

EXAMPLE 10

9,9-dioctylfluorene-2,7-diboronic acid (10). A mixture of 11 g (20 mmol) 9,9-di-(n-octyl)-2,7-dibromofluorene (9a), 1.44 g (60 mmol) magnesium turning and a catalytic amount of iodine in 50 mL dried ThF under argon was heated carefully to form a Grignard reagent. The reagent was then transferred to a stirred solution of 34 mL (200 mmol) triethyl borate in dry THF at −78° C. over a period of 2 h. The mixture was then slowly warmed to room temperature and kept stirring for 2 days. It was then poured into cold 2 N HCl while stirring. The mixture was extracted with ether and washed with brine, and dried. The crude solid was then purified by silica column chromatography to give a white product (2.96 g, yield 31%). $^1H$ NMR (DMSO-d6), δ (ppm): 8.01 (4H, s), 7.82 (2H, s), 7.73 (4H, d), 1.94 (4H, m), 1.04~1.14 (20H, m), 0.76 (6H, t), 0.46 (4H, m).

EXAMPLE 11

9,9-dioctylfluorene-2,7-bis(trimethylene boronate) (11). A mixture of 2.77 g (5.80 mmol) 9,9-dioctylfluorene-2,7-diboronic acid (10) and 7 g (9 mmol) 1,3-propylenediol in 200 mL toluene was refluxed for 10 h. The organic layer was washed with brine and concentrated to give a white solid. It was then recrystallized from hexane to give 2.5 g (yield 76%, mp. 120~122° C.) product. $^1H$ NMR ($CDCl_3$), δ (ppm): 7.73 (2H, d), 7.70 (2H, s), 7.67 (2H, d), 4.18 (8H, t), 2.07 (4H, m), 1.96 (4H, m), 10.78~1.24 (30H, m).

The synthetic route for the polymers prepared in Example 12 is shown in Schemes 3 and 4.

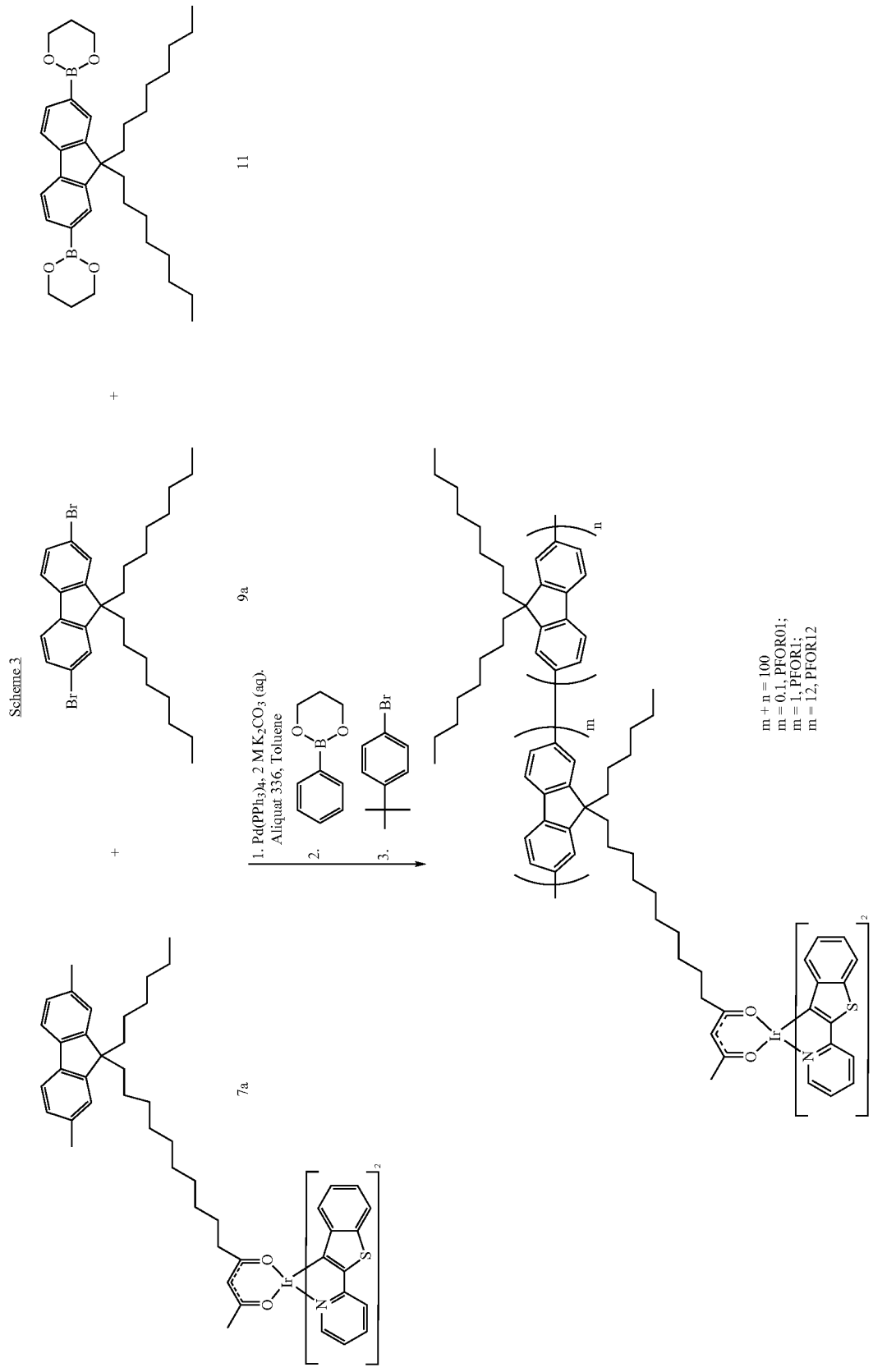

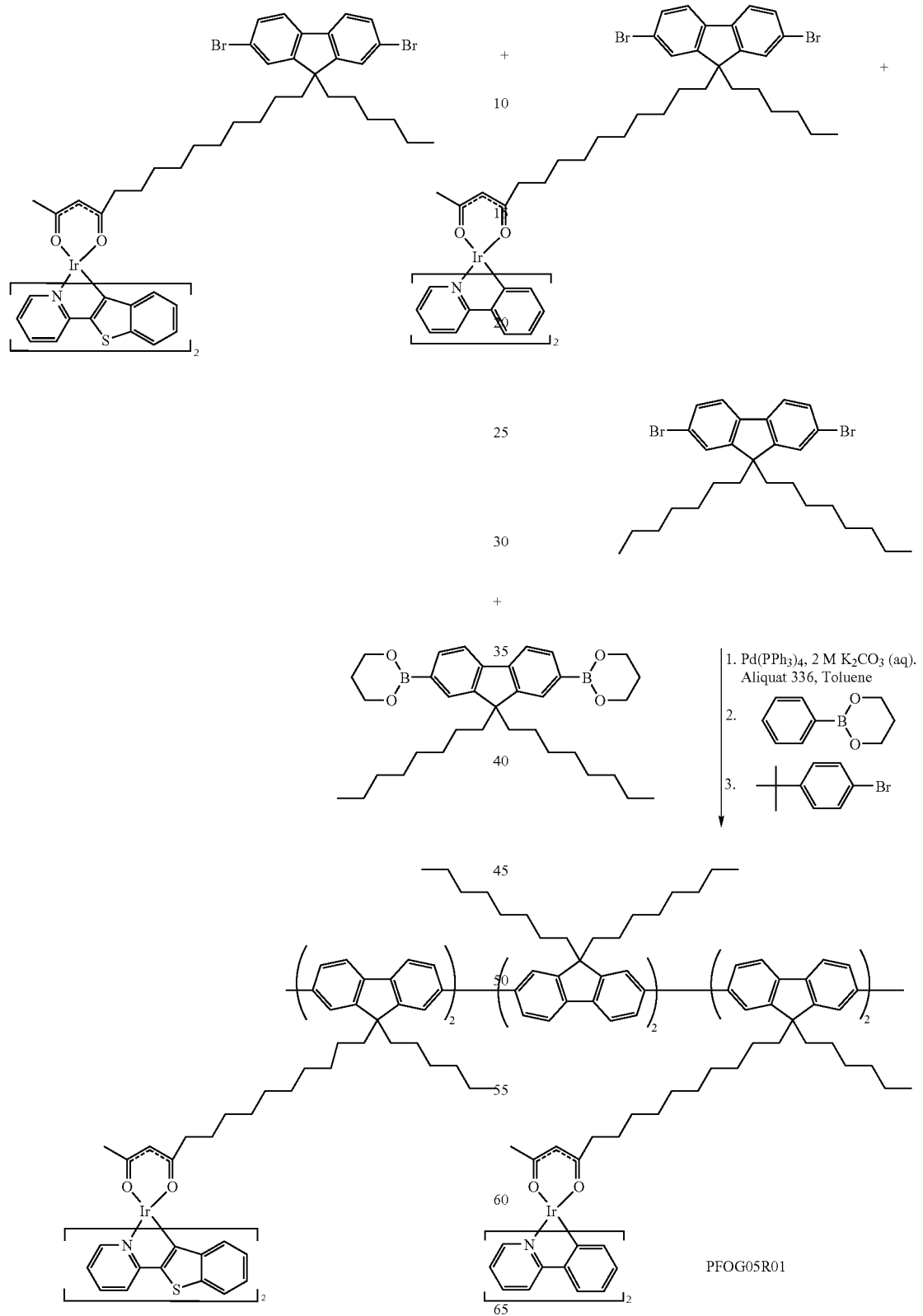

EXAMPLE 12

General Procedures of Polymerization for Polymers without Cz Group by Suzuki Cross Coupling Method, Taking PFO as an Example To a bottle with 9,9-dioctylfluorene-2,7-bis(trimethylene boronate) (0.584 g, 1.05 mmol), 2,7-dibromo-9,9-di-n-octylfluorene (0.576 g, 1.05 mmol), tetrakis-(triphenylphosphine)palladium (3 mg) and potassium carbonate (0.52 g, 3.8 mmol) were added Aliquat 336 (0.10 g, 0.25 mmol) in toluene (10 mL) and degassed water (1.8 mL) by syringe under argon. The mixture was stirred and heated at 85° C. for 5 days. Then, the polymer was capped by adding 0.1 mL of phenyl-dioxopropyleneboronate followed by heating for one day and 0.2 mL of p-(t-butyl)bromobenzene followed by heating for another day. The mixture was poured into methanol. The precipitate was collected by filtration and dried and then re-dissolved in THF, and again precipitated in methanol followed by washing and drying. $^1$H NMR: (CDCl$_3$), δ (ppm): 7.81 (d, 2H), 7.68 (m, 4H), 2.11 (m, 4H), 1.12~1.24 (m, 20H), 0.79~0.92 (m, 10H). $^{13}$C NMR (CDCl$_3$) δ (ppm): 151.79, 140.48, 140.00, 126.15, 121.47, 119.95, 61, 55.32, 40.38, 31.78, 30.02, 29.21, 23.90, 22.59, 14.06. Anal. Calcd for C$_{29}$H$_{40}$: C, 89.62; H, 10.38. Found: C, 88.85; H, 10.09. The yields for the polymer PFO and the following polymers by the Suzuki method were in the range 60~90%.

PFOR01: $^1$H NMR: (CDCl$_3$), δ (ppm): 7.82 (d, 2H), 7.68 (m, 4H), 2.11 (m, 4H), 1.12~1.55 (m, 20H), 0.78~0.82 (m, 10H). Anal. Calcd: C, 89.56; H, 10.36; Found: C, 88.28; H, 10.33.

PFOR1: $^1$H NMR: (CDCl$_3$) δ (ppm): 7.82 (d, 2H), 7.68 (m, 4H), 2.11 (m, 4H), 1.12~1.54 (m, 20H), 0.77~0.81 (m, 10H). Anal. Calcd: C, 88.96; H, 10.24; Found: C, 87.30; H, 10.72.

PFOR12: $^1$H NMR: (CDCl$_3$), δ (ppm): 7.82 (d, 2H), 7.68 (m, 4H), 2.11 (m, 4H), 1.12~1.54 (m, 20H), 0.78~0.81 (m, 10H). 8.41 (s, 7%×1H), 7.03 (m, 7%×2H), 6.93 (m, 7%×2H), 6.78 (m, 7%×2H), 6.25 (d, 7%×1H), 6.18 (d, 7%×1H), 5.19 (s, 7%×1H). Anal. Calcd: C, 82.93; H, 9.03; N, 0.71; S, 1.63. Found: C, 84.43; H, 9.02; N, 0.22; S, 0.60. According to the NMR data, the Ir-content in the copolymer is around 7%.

PFOG05R01: $^1$H NMR: (CDCl$_3$), δ (ppm): 7.82 (d, 2H), 7.68 (m, 4H), 2.11 (m, 4H), 1.12~1.54 (m, 20H), 0.77~0.81 (m, 10H). Anal. Calcd: C, 89.32; H, 10.31; Found: C, 86.17; H, 10.16.

The synthetic route for the polymers prepared in Example 13 is shown in Scheme 5.

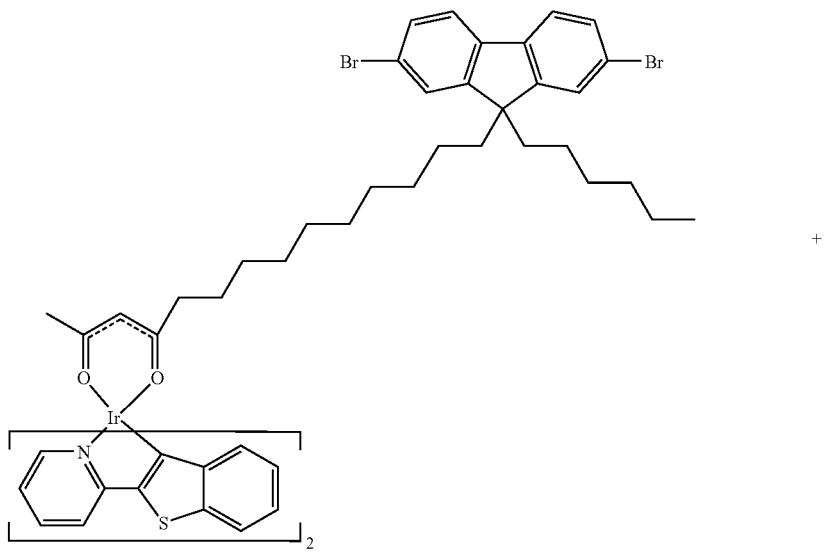

Scheme 5

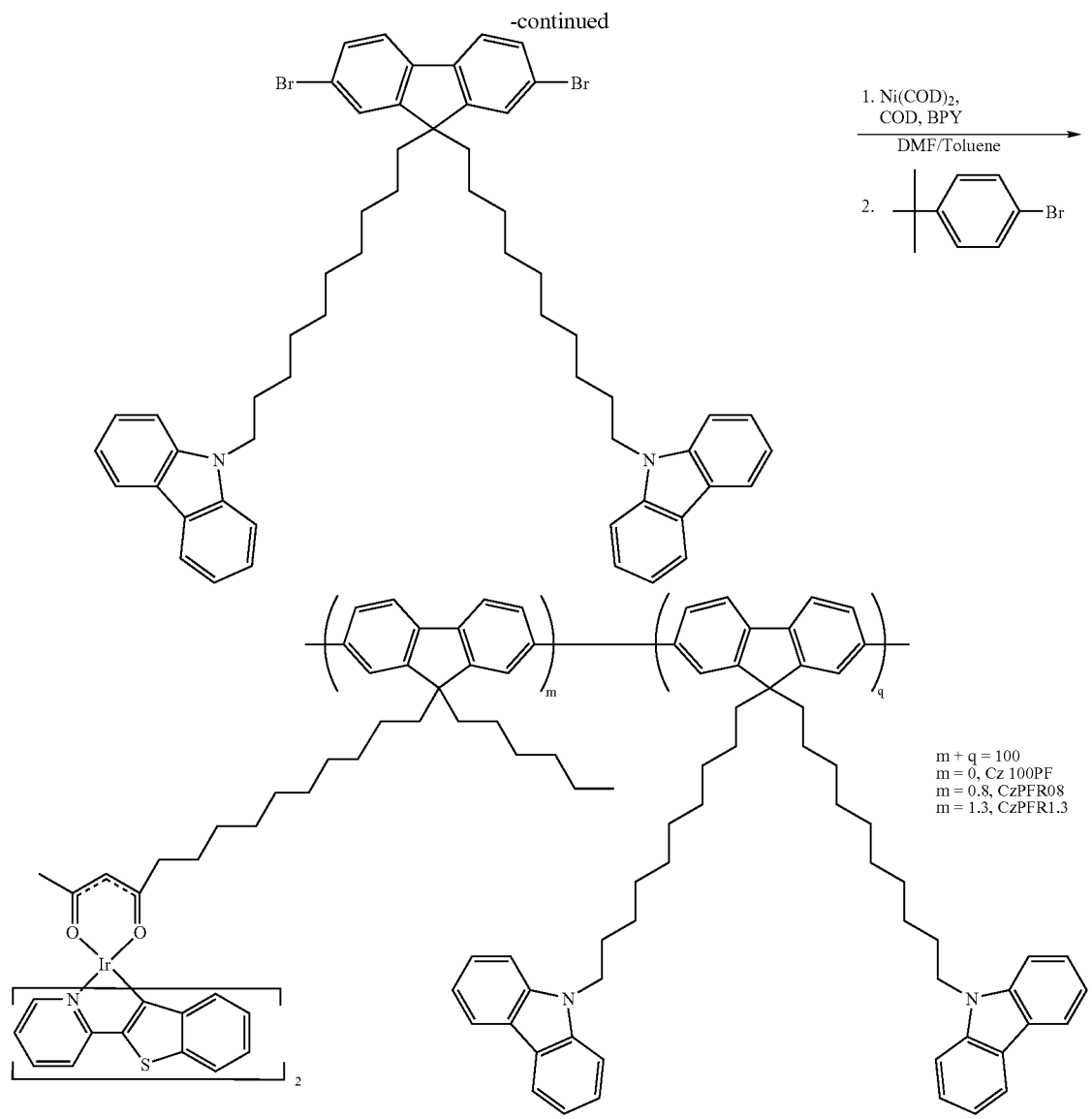

EXAMPLE 13

General Procedures of Polymerization for Polymers with Cz Group by the Yamamoto Reaction, Taking Cz100PF as an Example Into a reactor, bis(1,5-cyclooctadiene) nickel (0) (Ni(COD)$_2$) (0.846 g, 3.08 mmol), 2,2-bipyridyl (BPY) (0.480 g, 3.08 mmol), 1,5-cyclooctadiene (COD) (0.334 g, 3.08 mmol) and anhydrous DMF (3 mL) were added in a dry box with nitrogen. This mixture was stirred at 80° C. for 30 min to form active catalyst. The monomer 9,9-bis (N-carbazolyl-decyl)-2,7-dibromofluorene (2 mmol) in 12 mL of anhydrous toluene was added to the mixture. The polymerization proceeded at 80° C. for 6 days in the dry box, then 1-bromo-4-tert-butylbenzene as end-capping agent (0.2 mmol, 378. L) was added to continually react for 24 h. The resulting polymer was purified by alumina oxide chromatography and precipitated in acetone/methanol (volume ratio=1:1) and finally dried under vacuum for 24 h. $^1$H-NMR (500 MHz, CDCl$_3$), δ (ppm): 8.04 (t, 4H), 7.75 (d, 2H), 7.64 (s, 4H), 7.13~7.40 (m, 12H), 4.14 (t, 4H), 2.03 (b), 1.71 (m, 4H), 0.76~1.23 (m, 32H). $^{13}$C NMR (CDCl$_3$) δ (ppm): 140.34, 125.50, 122.74, 120.28, 118.63, 108.59, 42.95, 29.94, 29.41, 29.35, 29.78, 29.12, 28.85, 27.20. Anal. Calcd: C, 88.37; H, 8.01; N 3.62. Found: C, 87.66; H, 8.19; N, 3.10. The yields for the polymer Cz100PF and the following polymers by the Yamamoto method were in the range 80~85%.

CzPFR08: $^1$H-NMR (CDCl$_3$), δ (ppm): 8.03 (d, 4H), 7.75 (d, 2H), 7.65 (s, 4H), 7.13~7.38 (m, 12H), 4.14 (t, 4H), 1.71 (m, 4H), 0.77~1.24 (m, 32H). $^{13}$C NMR (CDCl$_3$) δ (ppm): 140.36, 125.50, 122.76, 120.29, 118.64, 108.59, 42.95, 29.94, 29.41, 29.34, 29.78, 29.12, 28.85, 27.21. Anal. Calcd: C, 88.12; H, 7.98; N, 3.61. Found: C, 88.29; H, 8.09; N, 3.42.

CzPFR13: $^1$H-NMR (CDCl$_3$), δ (ppm): 8.03 (d, 4H), 7.75 (d, 2H), 7.65 (s, 4H), 7.13~7.38 (m, 12H), 4.14 (t, 4H), 1.72 (t, 4H), 0.77~1.24 (m, 32H). $^{13}$C NMR (CDCl$_3$) δ (ppm): 151, 140.36, 125.50, 122.76, 120.28, 118.64, 108.59, 55, 42.95, 29.94, 29.41, 29.34, 29.78, 29.12, 28.85, 27.21. Anal. Calcd: C, 87.96; H, 7.97; N, 3.60. Found: C, 88.10; H, 8.11; N, 3.23.

The actual compositions of the polymers are somewhat different from the feed ratios used. The Ir-complex content in PFOR12 is about 7 mol % according to the NMR measurement. The weight average molecular weight and polydipersity (PDI) of the polyfluorenes synthesized are shown in the following Table.

| Polymer | Mw ($10^4$) | PDI |
| --- | --- | --- |
| PFO | 16.0 | 3.21 |
| PFOR01 | 7.1 | 2.54 |
| PFOR1 | 7.4 | 1.99 |
| PFOR12 | 13.0 | 3.58 |
| PFOG05R01 | 2.5 | 1.87 |
| Cz100PF | 8.5 | 2.79 |
| CzPFR08 | 12.5 | 2.47 |
| CzPFR1.3 | 15.4 | 2.73 |

EXAMPLE 14

14-(2,5-dibromo-4-butoxy-phenoxy)-tetradecane-2,4-dione. To a solution of 12-(2,5-dibromo-4butoxy-phenoxy)-dodecan-2-one (12.5 mmol, 6.3 g) in 50 mL ethyl acetate Na (24.9 mmol, 573 mg) was added. The mixture was refluxed for 12 h and then cooled to room temperature. The reaction was stopped by adding ice to the mixture, which was then neutralized by adding a diluted $H_2SO_4$, and extracted with ether. The crude product was purified by silica chromatography to obtain a yellow solid 3.42 g (yield 50%). The structure was confirmed by NMR.

Pt yellow complex monomer 1-butoxy-4-(platinum(II) bis(2-phenylbenzothiazolato-N,$C^{2'}$))(tetradecanedionate-11,13)-2,5-dibromobenzene. $K_2PtCl_4$ salt (0.48 mmol, 200 mg) and 2.5 equivalent cyclometalating ligand 2-phenylbenzothiazole (1.2 mmol, 254 mg) were dissolved in the mixture of 2-ethoxyethanol (15 mL) and water (5 mL) (3:1 by weight) and allowed to react at 80° C. for 16 hrs. To the resulting solution after cooling down to room temperature, 10 equivalent $K_2CO_3$ (4.8 mmol, 663 mg) and 2.5 equivalent 14-(2,5-dibromo-4-butoxy-phenoxy)-tetradecane-2,4-dione (1.2 mmol, 658 mg) were added and the reaction was carried out at 100° C. for 16 hrs. After cooling down to room temperature, the solvent was removed in vacuo. The crude product was purified by flash chromatography using dichloromethane as eluent and then further recrystallized with dichloromethane/methanol mixture. The product so obtained is yellow solid and the yield is 9.6%.

EXAMPLE 15

Polymer PPFPtY. This polymer was prepared by using the procedures similar to those described in Example 12. 1-Butoxy-4-(platinum(II) bis(2-phenylbenzothiazolato-N,$C^{2'}$))(tetradecanedionate-11,13)-2,5-dibromobenzene (6.05 mol) prepared in Example 14 and 2,7-dibromo-9,9-di-n-octylfluorene (0.5 mmol) were used.

EXAMPLE 16

Device fabrication and characterization. An indium-tin oxide (ITO) glass plate was exposed on oxygen plasma at a power of 30 W and a pressure of 200 mTorr for 5 minutes. A thin hole injection layer (40 nm) of poly(styrene sulfonic acid) doped poly(ethylenedioxythiophene) (PEDOT-PSS) (Baytron P CH 8000 from Bayer, its conductivity is $10^{-5}$ S/cm.) was spin-coated on the treated ITO. On top of it, a thin layer (80~120 nm) of the polyfluorene prepared in Examples 13 or 15 of the present invention was spin-cast from its solution in THF (7~10 mg/mL). Finally, a thin layer of calcium (about 5 nm) covered with a layer of aluminum was deposited in a vacuum thermal evaporator through a shadow mask at a pressure of less than $10^{-6}$ Torr. The active area of the diode is about 10 $mm^2$.

Figure 2:
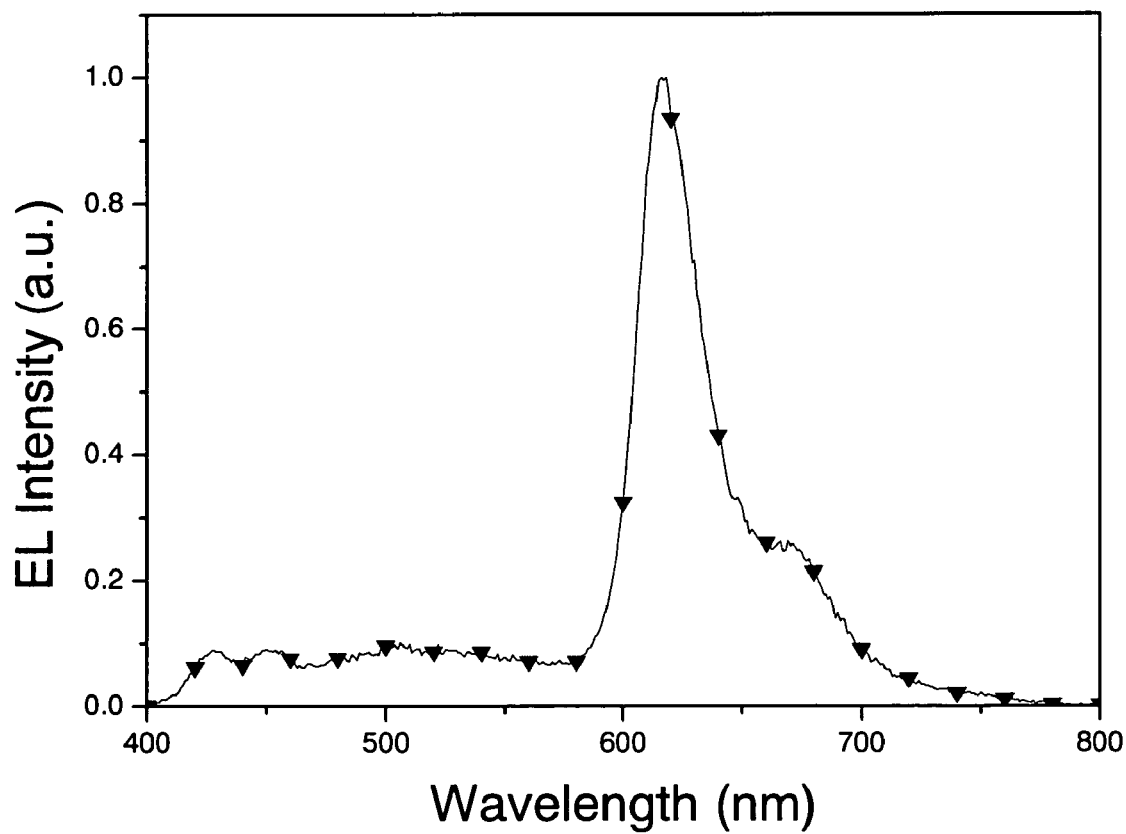
FIG. 2 shows an electroluminescent (EL) spectrum of the PLED in FIG. 1.

FIG. 1 is a plot showing the relationship between current density-voltage-brightness of a polymer light-emitting diode (PLED), ITO/PEDOT/CzPFR1.3/Ca/Al, prepared above. This PLED device emits red light after being subjected to a positive bias, and its electroluminescent (EL) spectrum is shown in FIG. 2. This PLED device has a turn-on voltage about 4.9 V, a maximum efficiency of 2.8 cd/A at 7 V, which remains high (1.6 cd/A at 15 V and 4321 $cd/m^2$), and a maximum brightness of 4321 $cd/m^2$.

Figure 3:
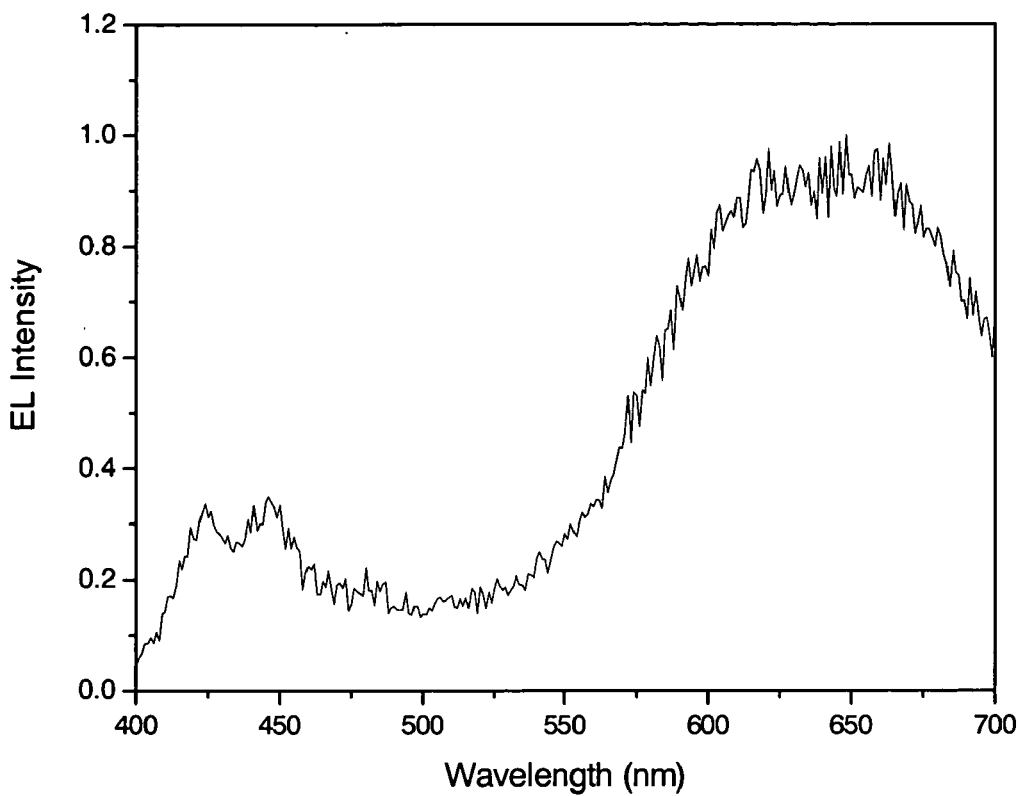
FIG. 3 shows an electroluminescent (EL) spectrum of a PLED, ITO/PEDOT/PPFPtY/Ca/Al, prepared in Example 16 of the present invention.

FIG. 3 shows an electroluminescent (EL) spectrum of a polymer light-emitting diode (PLED), ITO/PEDOT/PPF-PtY/Ca/Al, prepared above. This PLED device emits yellow light.

Figure 4:
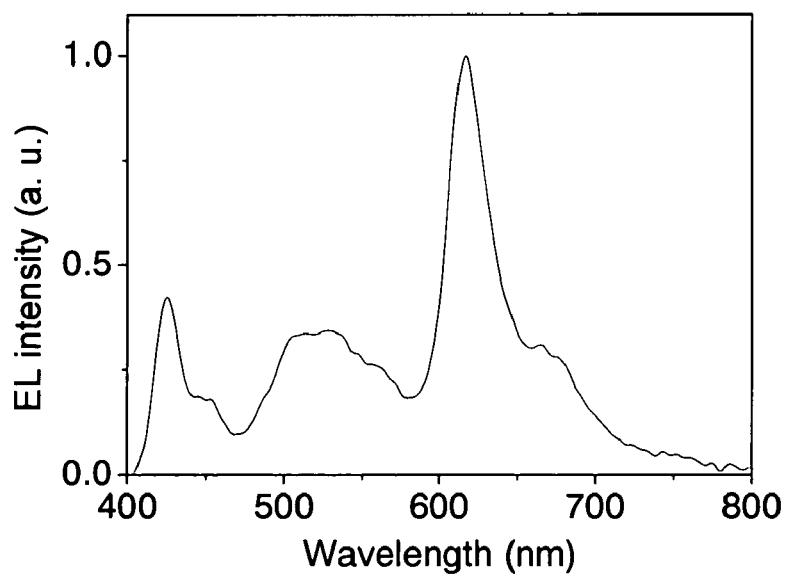
FIG. 4 shows an electroluminescent (EL) spectrum of a PLED, ITO/PEDOT/CzPFR08/Ca/Al, prepared in Example 16 of the present invention.

FIG. 4 shows an electroluminescent (EL) spectrum of a polymer light-emitting diode (PLED), ITO/PEDOT/CzPFR08/Ca/Al, prepared above. This PLED device emits light with broad band containing multiple color peaks.

The invention claimed is:

1. An organic light emitting diode, which comprises: a positive electrode formed on a substrate; a negative electrode; and a light emitting layer disposed between said positive electrode and said negative electrode, wherein said light emitting layer comprises the electroluminescent conjugated polymer comprising a side chain comprising a phosphorescent organometallic complex.

2. The organic light emitting diode as claimed in claim 1 further comprising an electron transporting layer formed between said light emitting layer and said negative electrode.

3. The organic light emitting diode as claimed in claim 1 further comprising a hole injection layer formed between said positive electrode and said light emitting layer.

4. The organic light emitting diode as claimed in claim 2 further comprising a hole transporting layer formed between said positive electrode and said light emitting layer.

5. The organic light emitting diode as claimed in claim 1 which is able to emit red light, yellow light, green light, blue light, white light or light with broad band containing multiple color peaks.

* * * * *